(12) United States Patent
Nendai

(10) Patent No.: US 9,818,808 B2
(45) Date of Patent: Nov. 14, 2017

(54) ORGANIC ELECTROLUMINESCENCE DISPLAY PANEL AND METHOD OF MANUFACTURING THE SAME

(71) Applicant: JOLED INC., Tokyo (JP)

(72) Inventor: Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/962,224

(22) Filed: Dec. 8, 2015

(65) Prior Publication Data

US 2016/0172423 A1 Jun. 16, 2016

(30) Foreign Application Priority Data

Dec. 10, 2014 (JP) .................................. 2014-250096

(51) Int. Cl.
*H01L 27/32* (2006.01)
*H01L 51/00* (2006.01)

(52) U.S. Cl.
CPC ...... *H01L 27/3246* (2013.01); *H01L 27/3211* (2013.01); *H01L 51/0005* (2013.01); *H01L 2227/323* (2013.01)

(58) Field of Classification Search
CPC ............. H01L 27/3246; H01L 27/3211; H01L 51/0005; H01L 2227/323
See application file for complete search history.

(56) References Cited

U.S. PATENT DOCUMENTS

| | | |
|---|---|---|
| 5,443,922 A | 8/1995 | Nishizaki et al. |
| 9,112,183 B2 | 8/2015 | Ohta |
| 9,153,791 B2 | 10/2015 | Akamatsu et al. |
| 2012/0223633 A1* | 9/2012 | Yoshinaga .......... H01L 27/3211 313/504 |
| 2013/0143346 A1* | 6/2013 | Nishiyama .......... H01L 51/5088 438/46 |
| 2014/0111725 A1 | 4/2014 | Miyamoto et al. |
| 2014/0306201 A1* | 10/2014 | Yamazaki .......... H01L 51/5271 257/40 |
| 2015/0069361 A1* | 3/2015 | Sato .................... H01L 51/5243 257/40 |

FOREIGN PATENT DOCUMENTS

| | | |
|---|---|---|
| JP | 05-163488 | 6/1993 |
| JP | 2008-287251 | 11/2008 |
| JP | 2013-191483 | 9/2013 |
| JP | 2014-075260 | 4/2014 |
| JP | 2014-085552 | 5/2014 |

* cited by examiner

*Primary Examiner* — Fernando L Toledo
*Assistant Examiner* — Neil Prasad
(74) *Attorney, Agent, or Firm* — Greenblum & Bernstein, P.L.C.

(57) ABSTRACT

An organic EL display panel including: a substrate; a first lower electrode and a second lower electrode disposed over the substrate with a gap therebetween in a first direction; a wall separating a space above the first lower electrode and a space above the second lower electrode from one another; organic light-emitting layers respectively disposed in the spaces; and an upper electrode extending over the organic light-emitting layers. The wall includes a first portion disposed over the gap and two second portions each of which is disposed over a different one of the first lower electrode and the second lower electrode. The first portion is between the two second portions in the first direction, and at least a part of a bottom face of the first portion is positioned higher than a bottom face of the second portion.

9 Claims, 16 Drawing Sheets

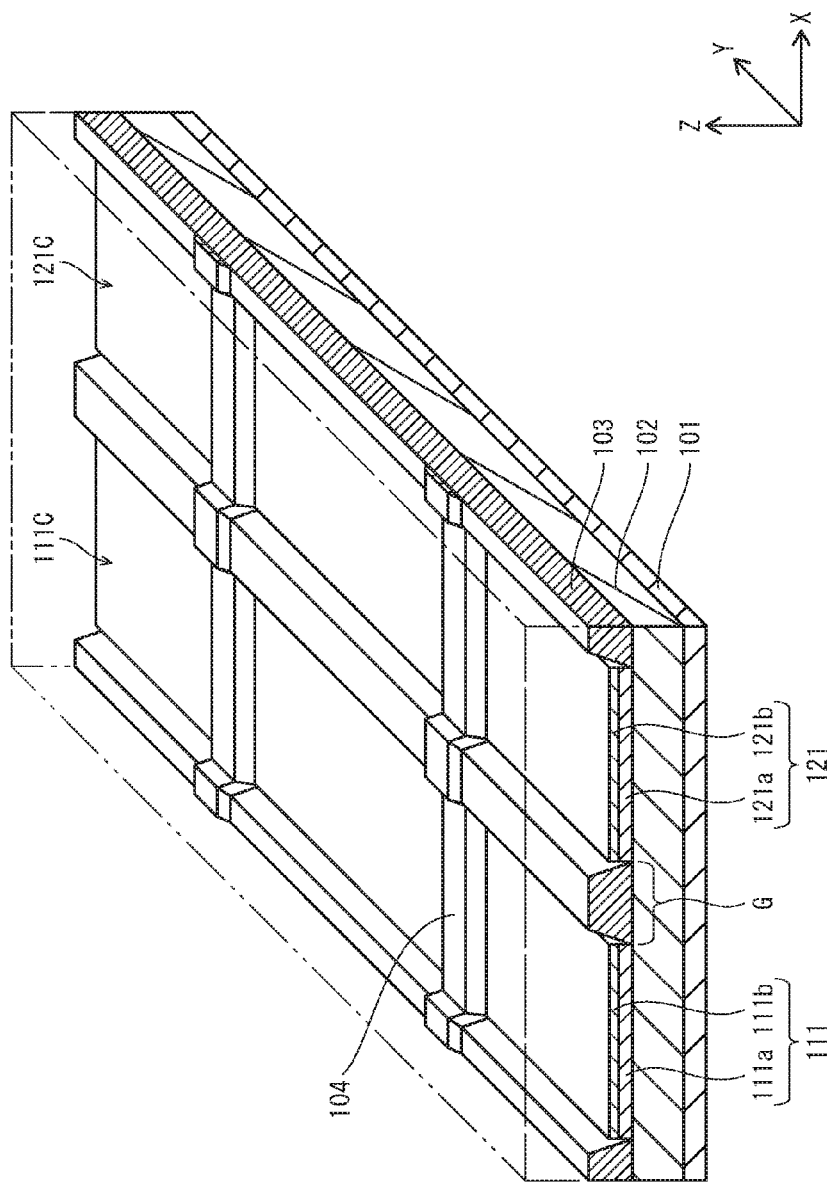

ORGANIC ELECTROLUMINESCENCE DISPLAY PANEL AND METHOD OF MANUFACTURING THE SAME

This application is based on an application No. 2014-250096 filed in Japan, the contents of which are hereby incorporated by reference.

BACKGROUND OF THE DISCLOSURE (1) Technical Field

The present disclosure relates to an organic electroluminescence display panel and a manufacturing method therefor, and particularly pertains to partition wall formation technology.

(2) Description of Related Art

In recent years, the commodification of organic electroluminescence (hereinafter also EL) display panels using organic electroluminescence elements for emitting light has been advancing. In an organic electroluminescence display panel, a plurality of organic electroluminescence elements are arranged in a direction along a top face of a substrate serving as a support member, and an image is displayed through light emission by the organic light-emitting elements. Each organic electroluminescence element includes a lower electrode, an organic light-emitting layer that includes an organic light-emitting material, and an upper electrode, layered in the stated order on the substrate. Holes and electrons supplied by the lower electrode and the upper electrode are recombined in the organic light-emitting layer, thus causing the organic light-emitting material to emit light.

Among formation methods for the organic light-emitting layer, a wet process of forming the organic light-emitting layer by applying a solution (hereinafter, ink) in which the organic light-emitting material is dissolved in organic solvent, followed by drying, is superb technology for considerations of formation precision, material usage efficiency, and so on relating to the organic light-emitting layer. In this wet process, a partition wall shaped to partition ink application areas is used in order to constrain a decrease in formation precision of the organic light-emitting layer due to spread of unnecessary ink spills during application.

The partition wall is formed from an electrically insulating material. Typically, a resin material is used as the electrically insulating material. A typical method of forming the partition wall from the resin material involves applying the resin material, using a photolithography method or the like to perform patterning, and then curing (i.e., post-baking) (see, for example, Japanese Patent Application Publication No. 2008-287251, Japanese Patent Application Publication No. 2013-191483, and Japanese Patent Application Publication No. 2014-75260). The above-described curing improves adhesion between the partition wall and a foundation thereof, enables improvements in resistance to organic solvents for the partition wall, and constrains the penetration of developing fluid and ink into the partition wall (see, for example, Japanese Patent Application Publication No. 2008-287251 and Japanese Patent Application Publication Application No. 2013-191483). Also, in a situation where the partition wall includes liquid-repellent components, the curing displaces the liquid-repellent components toward the surface side. As such, this enables the liquid-repellent properties of the partition wall surface to be improved (see, for example, Japanese Patent Application Publication No. 2014-75260).

In addition, the above-described electrically insulating material may be silicon oxide or a similar inorganic material.

In such a situation, the partition wall is frequently formed using a dry process such as vacuum deposition or chemical vapor deposition (hereinafter, CVD).

SUMMARY OF THE DISCLOSURE

In the field of display panels, progress is being made in high-definition pixels, and the space between pixels is growing smaller. As such, running of applied ink beyond the partition wall is growing more common during the formation of the organic light-emitting layer. When such ink running occurs, the film thickness formation precision of the organic light-emitting layer is decreased, which leads to irregular color emission and brightness among the pixels as well as dead pixels, to decreases in useful light-emitting life, and so on. As such, the quality of the organic electroluminescence display panel is degraded.

Thus, an aim of the present disclosure is provide an organic electroluminescence display panel of stable quality, with a configuration in which ink running during organic light-emitting layer formation is unlikely, as well as a manufacturing method therefor.

In order to achieve this aim, one aspect of the present disclosure is an organic electroluminescence display panel, including: a substrate; a first lower electrode and a second lower electrode disposed over the substrate and spaced away from one another in a first direction along a top face of the substrate by a gap therebetween; a partition wall made of an electrically insulating material and separating a space above the first lower electrode and a space above the second lower electrode from one another, the partition wall including a first portion disposed over the gap and two second portions each of which is disposed over a different one of the first lower electrode and the second lower electrode, the first portion disposed between the two second portions in the first direction; a first organic light-emitting layer and a second organic light-emitting layer respectively disposed in the space above the first lower electrode and the space above the second lower electrode; and an upper electrode extending over the first organic light-emitting layer and the second organic light-emitting layer. In the organic electroluminescence display panel, at least a part of a bottom face of the first portion is positioned higher than a bottom face of the second portion.

Due to at least a part of the bottom face of the first portion being positioned higher than the bottom face of the second portion, the partition wall top face is constrained from sinking with respect to the first portion during formation of the partition wall. That is, the organic electroluminescence display panel has a configuration in which ink running during the formation of the organic light-emitting layer is unlikely, and provides stable quality.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 5 is a schematic perspective view diagram illustrating a state of the organic electroluminescence display panel 10 prior to forming a partition wall 105.

FIG. 6A illustrates formation of an inter-layer insulation layer, FIG. 6B illustrates formation of a convex layer, and FIG. 6C illustrates formation of a lower electrode.

FIG. 7A illustrates formation of a pixel insulation layer, FIG. 7B illustrates formation of the partition wall, and FIG. 7C illustrates formation of a hole transport layer.

FIG. 8A illustrates ink application during formation of an organic light-emitting layer, FIG. 8B illustrates ink drying during the formation of the organic light-emitting layer, and FIG. 8C illustrates formation of an electron transport layer and an upper electrode.

FIG. 9A illustrates application of a resin material, FIG. 9B illustrates exposure, and FIG. 9C illustrates developing.

FIG. 11A illustrates application of a resin material, FIG. 11B illustrates exposure, and FIG. 11C illustrates developing.

FIG. 12A illustrates application of a resin material, FIG. 12B illustrates dry etching, and FIG. 12C illustrates resist peeling.

FIG. 16A illustrates a resin material immediately after patterning, FIG. 16B illustrates the effect of partition wall shape on ink application, and FIG. 16C illustrates the effect of pixel spacing on ink application.

BACKGROUND LEADING TO THE DISCLOSURE

Figure 16A:
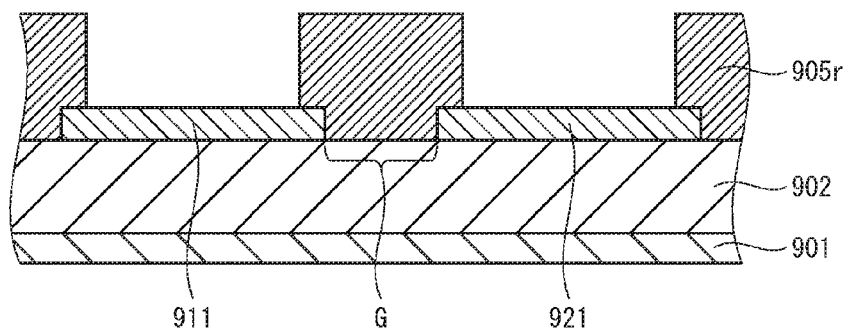
FIGS. 16A, 16B, and 16C are schematic cross-sectional diagrams explaining ink running in organic electroluminescence display panels, where
Figure 16B:
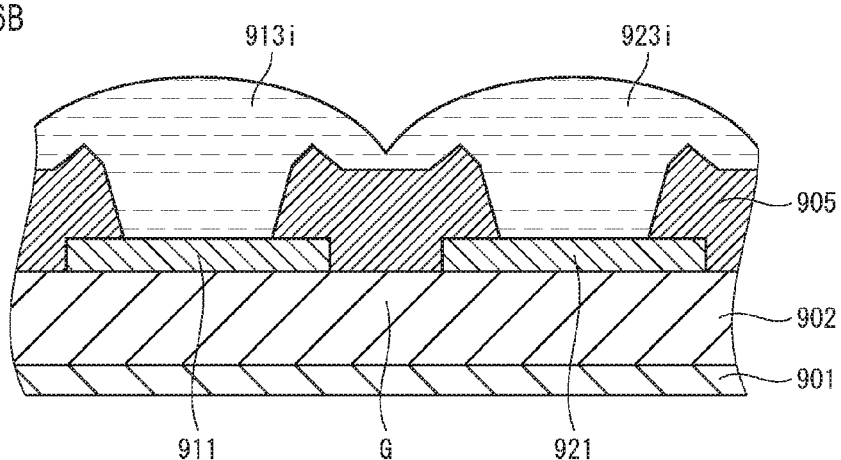
Figure 16C:
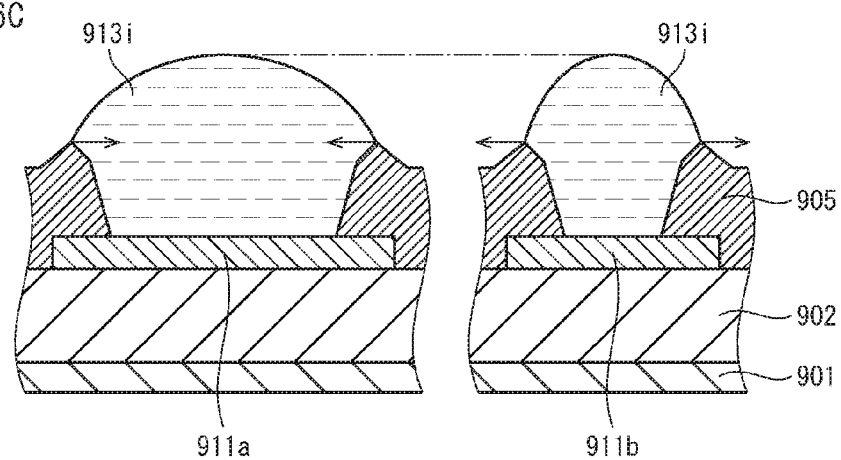

The inventor of the present disclosure (hereinafter also termed the present inventor) has discovered that the shape of partition walls is an issue in the advancement of high-definition organic electroluminescence display panels equipped with an organic light-emitting layer formed by a wet process. This issue is described with reference to FIGS. 16A, 16B, and 16C. FIGS. 16A, 16B, and 16C are schematic cross-sectional diagrams intended to explain the running of ink in an organic electroluminescence display panel. In the following, description is provided taking as an example an organic electroluminescence display panel having pixels realizing full color display, due to the pixels each being composed of sub-pixels that respectively emit light in one of red, blue, and green and that are each configured by using an organic electroluminescence element.

FIGS. 16A and 16B illustrate cross-sections in which neighboring sub-pixels are aligned. A first lower electrode 911 and a second lower electrode 921 are disposed over a substrate 901 having an inter-layer insulation layer 902 arranged thereon. The first lower electrode 911 and the second lower electrode 921 are aligned along a first direction (the lateral direction on the page) above a top face of the substrate 901, with a gap G therebetween. Also, as illustrated in FIG. 16B, a partition wall 905 is arranged over the gap G. The partition wall 905 separates a space above the first lower electrode 911 and a space above the second lower electrode 921 from one another. The partition wall 905 takes up a formation margin taking an alignment margin into consideration. As such, the partition wall 905 is formed not only with a portion above the gap G but also with portions above the lower electrodes 911, 921 neighboring the portion above the gap G in the first direction.

Here, as illustrated in FIG. 16A, in a situation where the partition wall 905 is formed from a resin material 905r, a top face of the resin material 905r immediately after patterning performed by a photolithography method conforms to the shape at application and is flat above the first lower electrode 901, above the gap G, and above the second lower electrode 921.

However, as illustrated in FIG. 16B, the present inventor has discovered that, upon curing the resin material 905r, the top face of the partition wall 905 takes on a shape, after curing, that conforms to irregularities on a bottom face of the partition wall 905. Specifically, the curing causes shrinkage of the resin material 905r. Thus, the present inventor has discovered that the top face of the partition wall 905 conforms to a concavity in the bottom face of the partition wall 905 at the gap G, sinks above the gap G, and takes on a concave shape.

In such circumstances, the height of the partition wall 905 becomes greatest at parts of the partition wall 905 facing the first lower electrode 911 and the second lower electrode 921. As such, ink 913i and ink 923i, each applied between a pair of partition walls 905, is easily able to cross the highest points of the partition walls 905. Also, in a situation where the partition walls 905 have a concave shape, the ink 913 and the ink 923i crossing the highest points spread over the top faces of the partition walls 905, and it is likely that the ink 913i and the ink 923i come in contact and combine, spilling over the partition walls 905. As such, the partition wall 905 having a concave top face is prone to ink running.

Particularly, the above-described concave partition wall is a point of concern regarding advances in high-definition organic electroluminescence display panels. For example, FIG. 16C illustrates the effect that pixel spacing has in applying ink 913i having identical liquid level height. Specifically, the pixel separation is narrowed at high definition, and due to this, the lower electrode 911b on the right-hand side is narrower than the lower electrode 911a on the left-hand side in FIG. 16C.

On the left-hand side of FIG. 16C, sufficient spacing is secured between the partition walls 905 with respect to the liquid level height of the ink 913i. That is, a half-oval joining the liquid level of the ink 913*i* and the highest points of partition walls 905 has a minor axis in the height direction and a major axis in the width direction. The surface tension of the ink 913*i* pulls toward the inner side of the ink 913*i*, as indicated by the arrows. Accordingly, the ink 913*i* is unlikely to cross the partition walls 905 on the left-hand side of FIG. 16C.

Conversely, on the right-hand side of FIG. 16C, the spacing between the partition walls 905 is insufficient with respect to the liquid level height of the ink 913*i*. That is, a half-oval joining the liquid level of the ink 913*i* and the highest points of partition walls 905 has a major axis in the height direction and a minor axis in the width direction. The surface tension of the ink 913*i* pulls toward the outer side of the ink 913*i*, as indicated by the arrows. Accordingly, the ink 913*i* easily crosses the highest points of the partition walls 905 and is prone to running on the right-hand side of FIG. 16C.

Thus, as illustrated on the left-hand side of FIG. 16C, the liquid level height of the ink 913*i* had not previously been an issue despite the presence of a concave top face of the partition wall 905. However, as advances in definition are made, the possibility of ink running occurring as illustrated on the right-hand side of FIG. 16C increases.

Also, the concave shape of the top face of the partition wall 905 occurs not only when the partition wall 905 is formed from the resin material 905*r*, but also when the partition wall 905 is formed from an inorganic material. This is because forming the partition wall 905 from an inorganic material involves a dry process. Thus, unlike FIG. 16A, the top face of the partition wall 905 reflects irregularities at the bottom face immediately after patterning (film formation), and sinking occurs over the gap G.

Accordingly, the partition wall 905 having the portion over the gap G and the portions over the lower electrodes 911, 921 neighboring that portion on both sides is prone to top face sinking over the gap G irrespective of whether the material used is a resin material or an inorganic material, as the top face takes on a concave shape.

One approach to constraining the running of ink is simply to increase the film thickness and raise the overall height of the partition wall. However, this method does not avoid the sinking of the top face of the partition wall over the gap G and the concavity of the top face where the ink is prone to flowing out remain as it is. Thus, the partition wall must be made excessively tall in order to constrain ink running. In such a situation, aside from posing difficulties in thinning the organic electroluminescence display panel, a great difference in height is produced over a short distance from the top faces of the lower electrodes to the highest points of the partition walls. As such, upper layers such as an upper electrode are prone to cracks, tier cutting, and so on.

According to the above, with focus on high definition organic electroluminescence display panels, and as a result of consideration of a configuration in which ink running is unlikely, that is, of an organic electroluminescence display panel in which sinking of the top face of the partition wall is constrained, the present inventor has arrived at aspects of the disclosure as described below.

DESCRIPTION OF EMBODIMENT

One aspect of the present disclosure is an organic electroluminescence display panel, including: a substrate; a first lower electrode and a second lower electrode disposed over the substrate and spaced away from one another in a first direction along a top face of the substrate by a gap therebetween; a partition wall made of an electrically insulating material and separating a space above the first lower electrode and a space above the second lower electrode from one another, the partition wall including a first portion disposed over the gap and two second portions each of which is disposed over a different one of the first lower electrode and the second lower electrode, the first portion disposed between the two second portions in the first direction; a first organic light-emitting layer and a second organic light-emitting layer respectively disposed in the space above the first lower electrode and the space above the second lower electrode; and an upper electrode extending over the first organic light-emitting layer and the second organic light-emitting layer. In the organic electroluminescence display panel, at least a part of a bottom face of the first portion is positioned higher than a bottom face of the second portion.

The organic electroluminescence display panel pertaining to one aspect of the present disclosure has at least part of the bottom face of the first portion positioned higher than the bottom face of the second portion. As such, sinking of the partition wall top face is constrained with respect to the first portion during formation of the partition wall. That is, the organic electroluminescence display panel has a configuration in which ink running is unlikely, and provides stable quality.

In the organic electroluminescence display panel pertaining to one aspect of the present disclosure, in the first direction, a central part of the bottom face of the first portion may be positioned higher than the bottom face of the second portion.

Accordingly, the center portion of the bottom face of the first portion in the first direction, where the top face is most prone to sinking, is positioned higher than the bottom face of the second portion. As such, the sinking of the partition wall top face is effectively constrained.

The organic electroluminescence display panel pertaining to one aspect of the present disclosure may further include a convex layer made of an electrically insulating material between the substrate and the first portion, having greater thickness than the first lower electrode and the second lower electrode.

Accordingly, a part of the foundation of the partition wall below the first portion protrudes upward with respect to a part of the foundation below the second portion. As such, the bottom face of the first portion, above the convex layer, is positioned higher than the bottom face of the second portion.

The organic electroluminescence display panel pertaining to one aspect of the present disclosure may further include an inter-layer insulating layer made of a resin material and disposed over the substrate, a shape of a top face of the inter-layer insulating layer in conformity with a shape of the top face of the substrate, the convex layer may be made of the resin material, and the first lower electrode, the second lower electrode, and the convex layer may be disposed over the inter-layer insulating layer.

The organic electroluminescence display panel pertaining to one aspect of the present disclosure may further include an inter-layer insulating layer made of a resin material and disposed over the substrate and the convex layer, a shape of a top face of the inter-layer insulating layer in conformity with a combination of a shape of the top face of the substrate and a top face of the convex layer, the convex layer may be made of the resin material, and the first lower electrode and the second lower electrode may be disposed over the inter-layer insulating layer.

Accordingly, the convex layer is formed from the same resin material as the inter-layer insulation layer. During the formation of the convex layer, the material, equipment, technology, and so on used in forming the inter-layer insulation layer may be re-used, enabling any decrease in manufacturing efficiency caused by the addition of the convex layer to be constrained.

The organic electroluminescence display panel pertaining to one aspect of the present disclosure may further include an inter-layer insulating layer made of a resin material and disposed over the substrate, a shape of a top face of the inter-layer insulating layer in conformity with a shape of the top face of the substrate, and the inter-layer insulating layer may include a planar portion on which the first lower electrode and the second lower electrode are disposed and a convex portion on the planar portion, the convex portion corresponding in position to the gap and protruding upward higher than a top face of the first lower electrode and a top face of the second lower electrode.

Accordingly, a part of the foundation of the partition wall below the first portion protrudes upward with respect to a part of the foundation below the second portion. As such, at least part of the bottom face is positioned higher than other parts of the bottom face.

In the organic electroluminescence display panel pertaining to one aspect of the present disclosure, in a second direction that is along the top face of the substrate and that is perpendicular to the first direction, the first lower electrode may be provided in plurality to form a line of first lower electrodes, and the second lower electrode may be provided in plurality of form a line of second lower electrodes, the first organic light-emitting layer may extend in the second direction over the line of first lower electrodes, and the second organic light-emitting layer may extend in the second direction over the line of second lower electrodes, and the partition wall may extend in the second direction between the first organic light-emitting layer and the second organic light-emitting layer, and in any cross-section taken along the second direction, at least a part of the bottom face of the first portion may be positioned higher than the bottom face of the second portion.

Accordingly, sinking of the top face of the partition wall is constrained at the first portion during the formation of the partition wall, along the second direction. That is, the organic electroluminescence display panel has a configuration in which ink running is unlikely across the second direction, and further provides stable quality.

The organic electroluminescence display panel pertaining to one aspect of the present disclosure may further include a convex layer formed from an electrically insulating material, disposed between the substrate and the first portion, and extending in the second direction, and the convex layer may have greater thickness than the first lower electrodes and the second lower electrodes.

Accordingly, a part of the foundation of the partition wall below the first portion protrudes upward with respect to a part of the foundation below the second portion. As such, at least part of the bottom face is positioned higher than other parts of the bottom face, in a lateral cross-section of the partition wall along the second direction.

The organic electroluminescence display panel pertaining to one aspect of the present disclosure may further include a pixel insulation layer formed from an electrically insulating material, extending in the first direction, and disposed between electrodes adjacent in the second direction, the electrodes adjacent in the second direction comprising a combination of two first lower electrodes and a combination of two second lower electrodes, and the pixel insulation layer has greater thickness than the first lower electrodes and the second lower electrodes, and has smaller thickness than the convex layer.

Accordingly, providing the pixel insulation layer enables improvements to the electrical insulation between neighboring pairs of the first lower electrodes and second lower electrodes, constrains tier cutting of the first organic light-emitting layer and the second organic light-emitting layer, and enables improvements to the electrical insulation between the first lower electrodes, the second lower electrodes, and the upper electrode.

In the organic electroluminescence display panel pertaining to one aspect of the present disclosure, the convex layer and the pixel insulation layer may form a single layer.

Accordingly, the convex layer and the pixel insulation layer may be formed simultaneously, enabling any decrease in manufacturing efficiency caused by the addition of the convex layer to be constrained.

In the organic electroluminescence display panel pertaining to one aspect of the present disclosure, a color of light emitted by the first organic light-emitting layer may differ from a color of light emitted by the second organic light-emitting layer.

Accordingly, not only decreases in film thickness formation precision but also mixing (color combination) of ink including different organic light-emitting materials may be constrained, and any decrease in quality of the organic electroluminescence display panel, such as faulty color emission of pixels, may also be constrained.

One aspect of the present disclosure is an organic electroluminescence display panel manufacturing method, including: preparing a substrate; forming a first lower electrode and a second lower electrode disposed over the substrate and spaced away from one another in a first direction along a top face of the substrate by a gap therebetween; forming a partition wall by using an electrically insulating material, the partition wall separating a space above the first lower electrode and a space above the second lower electrode from one another and including a first portion disposed over the gap and two second portions each of which being disposed over a different one of the first lower electrode and the second lower electrode, the first portion disposed between the two second portions in the first direction; performing a wet process to form a first organic light-emitting layer and a second organic light-emitting layer in the space above the first lower electrode and the space above the second lower electrode, respectively; and forming an upper electrode extending over the first organic light-emitting layer and the second organic light-emitting layer. In the organic electroluminescence display panel manufacturing method, at least a part of a bottom face of the first portion is positioned higher than a bottom face of the second portion.

According to the organic electroluminescence display panel manufacturing method pertaining to one aspect of the present disclosure, sinking of the partition wall top face over the first portion is constrained during formation of the partition wall, and ink running is unlikely to occur during formation of the organic light-emitting layers. As such, the quality of the manufactured organic electroluminescence display panel is stabilized.

The organic electroluminescence display panel manufacturing method pertaining to one aspect of the present disclosure may further include, before forming the first lower electrode and the second lower electrode: forming an inter-layer insulating layer over the substrate by using a resin material, a shape of a top face of the inter-layer insulating layer in conformity with a shape of the top face of the substrate; and forming a convex layer over the interlayer-insulating layer by using the resin material, the convex layer extending in a second direction that is along the top face of the substrate and that is perpendicular to the first direction, and the first lower electrode and the second lower electrode may be formed over the inter-layer insulating layer at opposite sides of the convex layer in the first direction and each with smaller thickness than the convex layer, such that at least a part of the bottom face of the first portion is positioned higher than the bottom face of the second portion.

The organic electroluminescence display panel manufacturing method pertaining to one aspect of the present disclosure may further include, before forming the first lower electrode and the second lower electrode: forming a convex layer over the substrate by using a resin material, the convex layer extending in a second direction that is along the top face of the substrate and that is perpendicular to the first direction; and forming an inter-layer insulating layer over the substrate and the convex layer by using the resin material, a shape of a top face of the inter-layer insulating layer in conformity with a combination of a shape of the top face of the substrate and a top face of the convex layer, and the first lower electrode and the second lower electrode may be formed over the inter-layer insulating layer at opposite sides of the convex layer in the first direction and each with smaller thickness than the convex layer, such that at least a part of the bottom face of the first portion is positioned higher than the bottom face of the second portion.

Accordingly, at least a part of the bottom face of the first portion over the convex layer is positioned higher than the bottom face of the second portion. Also, the convex layer is formed from the same resin material as the inter-layer insulation layer. As such, during the formation of the convex layer, the material, equipment, technology, and so on used in forming the inter-layer insulation layer may be re-used, enabling any decrease in manufacturing efficiency caused by the addition of the convex layer to be constrained.

The organic electroluminescence display panel manufacturing method pertaining to one aspect of the present disclosure may further include, before forming the first lower electrode and the second lower electrode: applying a resin material over the substrate so that a shape of a top face of a film of the applied resin material is in conformity with a shape of the top face of the substrate; and forming an inter-layer insulating layer by reducing a thickness of a part of the film with a photolithography method using a half-tone mask, the inter-layer insulating layer including a planar portion whose top face has a shape in conformity with the shape of the top surface of the substrate and a convex portion protruding upward with respect to the planar portion, and the first lower electrode and the second lower electrode may be formed over the planar portion at opposite sides of the convex portion in the first direction and each with smaller thickness than the convex portion, such that at least a part of the bottom face of the first portion is positioned higher than the bottom face of the second portion.

The organic electroluminescence display panel manufacturing method pertaining to one aspect of the present disclosure may further include, before forming the first lower electrode and the second lower electrode: applying a resin material over the substrate so that a shape of a top face of a film of the applied resin material is in conformity with a shape of the top face of the substrate; and forming an inter-layer insulating layer by reducing a thickness of a part of the film with a photolithography method using dry etching, the inter-layer insulating layer including a planar portion whose top face has a shape in conformity with the shape of the top surface of the substrate and a convex portion protruding upward with respect to the planar portion, and the first lower electrode and the second lower electrode may be formed over the planar portion at opposite sides of the convex portion in the first direction and each with smaller thickness than the convex portion, such that at least a part of the bottom face of the first portion is positioned higher than the bottom face of the second portion.

Accordingly, at least a part of the bottom face of the first portion over the convex layer is positioned higher than the bottom face of the second portion. Also, the convex layer is formed in the same process as the inter-layer insulation layer. Thus, during the formation of the convex layer, the material, equipment, technology, and so on used in forming the inter-layer insulation layer may be re-used, enabling any decrease in manufacturing efficiency caused by the addition of the convex layer to be constrained.

In the organic electroluminescence display panel manufacturing method pertaining to one aspect of the present disclosure, the first lower electrode and the second lower electrode may be formed such that, in a second direction that is along the top face of the substrate and that is perpendicular to the first direction, the first lower electrode is formed in plurality to form a line of first lower electrodes, and the second lower electrode is formed in plurality of form a line of second lower electrodes, the first organic light-emitting layer may be formed to extend in the second direction over the line of first lower electrodes, and the second organic light-emitting layer may be formed to extend in the second direction over the line of second lower electrodes, and the partition wall may be formed to extend in the second direction over the gap, and so that in any cross-section taken along the second direction, at least a part of the bottom face of the first portion is positioned higher than the bottom face of the second portion.

The organic electroluminescence display panel manufacturing method pertaining to one aspect of the present disclosure may further include, before forming the first lower electrodes and the second lower electrodes, forming a convex layer by using an electrically insulating material, the convex layer formed over the substrate to extend in the second direction, and the first lower electrodes and the second lower electrodes may be formed at opposite sides of the convex layer in the first direction with smaller thickness than the convex layer, and in any cross-section of the partition wall taken along the second direction, at least a part of the bottom face of the first portion may be positioned higher than the bottom face of the second portion.

Accordingly, sinking of the top face of the partition wall over the first portion is constrained along the second direction during formation of the partition wall, and ink running is unlikely to occur in the second direction during formation of the organic light-emitting layers. As such, the quality of the manufactured organic electroluminescence display panel is further stabilized.

The organic electroluminescence display panel manufacturing method pertaining to one aspect of the present disclosure may further include, before forming the partition wall: applying a resin material along the top face of the substrate having the line of first lower electrodes and the line of second lower electrodes formed thereon, so that a film of the applied resin material has greater thickness than the first lower electrodes and the second lower electrodes; and forming a convex layer and a pixel insulation layer by removing parts of the film over the first lower electrodes and the second lower electrodes with a photolithography method using a half-tone mask and thereby reducing the thickness of the film at the parts, the convex layer formed to have greater thickness than the first lower electrodes and the second lower electrodes and to extend in the second direction between the line of the first lower electrodes and the line of the second lower electrodes, the pixel insulation layer formed to have greater thickness than the first lower electrodes and the second lower electrodes and smaller thickness than the convex layer and to extend in the first direction between electrodes adjacent in the second direction, the electrodes adjacent in the second direction comprising a combination of two first lower electrodes and a combination of two second lower electrodes, and in any cross-section of the partition wall taken along the second direction, at least a part of the bottom face of the first portion may be positioned higher than the bottom face of the second portion.

Accordingly, forming the pixel insulation layer enables improvements to the electrical insulation between neighboring pairs of the first lower electrodes and second lower electrodes, constrains tier cutting of the first organic light-emitting layer and the second organic light-emitting layer, and enables improvements to the electrical insulation between the first lower electrodes, the second lower electrodes, and the upper electrode. Also, in the above-described manufacturing method, the convex layer and the pixel insulation layer may be formed simultaneously, enabling any decrease in manufacturing efficiency caused by the addition of the convex layer to be constrained.

In the present document, the term "over" indicates not only an upper direction (vertically above) in an absolute spatial sense, but also includes relative positional relationships defined in terms of lamination order in the laminated structure of the organic electroluminescence display panel. Specifically, in the organic electroluminescence display panel, an upward direction is defined as a direction oriented perpendicularly to a main surface of a substrate toward laminated components, beginning from the substrate. Also, for example, the wording "over the substrate" does not only designate a region in direct contact with the substrate, but also includes a region above the substrate across from laminated components. Also, for example, the wording "above the substrate" does not only designate a region above the substrate with spacing therebetween but also includes a region over the substrate.

(Embodiment)

An organic electroluminescence display panel pertaining to an embodiment of the present disclosure is described below, with reference to the accompanying drawings. Here, the drawings include schematic representations. The components may differ from reality in being reduced in size, having different aspect ratios, and so on.

1. Overall Configuration of Organic Electroluminescence Display Device 1

Figure 1:
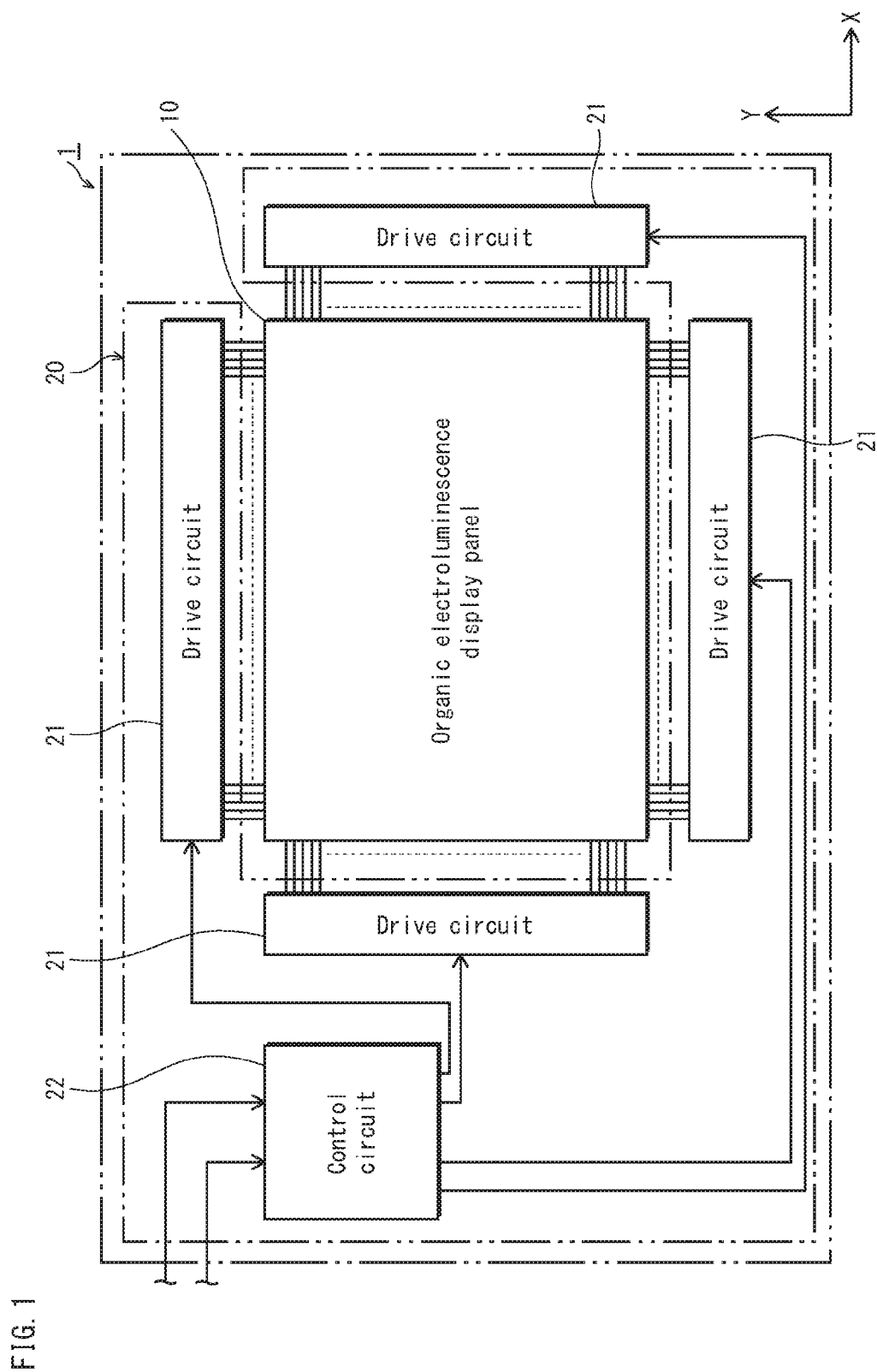
FIG. 1 is a block diagram illustrating the overall configuration of an organic electroluminescence display device 1.

FIG. 1 is a block diagram illustrating the overall configuration of an organic electroluminescence display device 1. The organic electroluminescence display device 1 is a display device used, for example, in a television, a personal computer, a mobile terminal, an industrial display (electronic signage, large screens for commercial use), or the like. The organic electroluminescence display device 1 is equipped with an organic electroluminescence display panel 10 and a drive control unit 20 electrically connected thereto.

The organic electroluminescence display panel 10 (hereinafter also termed a panel 10) is, for example, a top emission display panel in which a top face is a rectangular image display face On the panel 10, a plurality of (non-diagrammed) organic electroluminescence elements are arranged along the image display face. An image is displayed by a combination of emitted light from the organic electroluminescence elements. Also, the panel 10 employs an active matrix method, for example.

The drive control unit 20 includes a drive circuit 21 connected to the panel 10, and a control circuit 22 connected to one of an external device such as a calculator, and a receiver device such as an antenna, or the like. The drive circuit 21 includes a power supply circuit supplying electric power to the organic electroluminescence elements, a signal circuit applying a voltage signal controlling the electric power supplied to the organic electroluminescence elements, a scanning circuit switching a location of application for the voltage signal at a fixed interval, and so on. The control circuit 22 controls operations of the drive circuit 21 in accordance with data in image information input from the external device and the receiver device.

In FIG. 1, the drive circuit 21 is disposed in plurality at four locations surrounding the panel 10, as an example. However, no such limitation is intended to the configuration of the drive control unit 20. The quantity and position of the drive circuits 21 may be adjusted as appropriate. In addition, for the following explanations, and as indicated in FIG. 1, the direction along a long edge of the top face of the panel 10 is the X direction, and the direction along a short edge of the top face of the panel 10 is the Y direction.

2. Panel 10 Configuration (1) Planar Configuration

Figure 2:
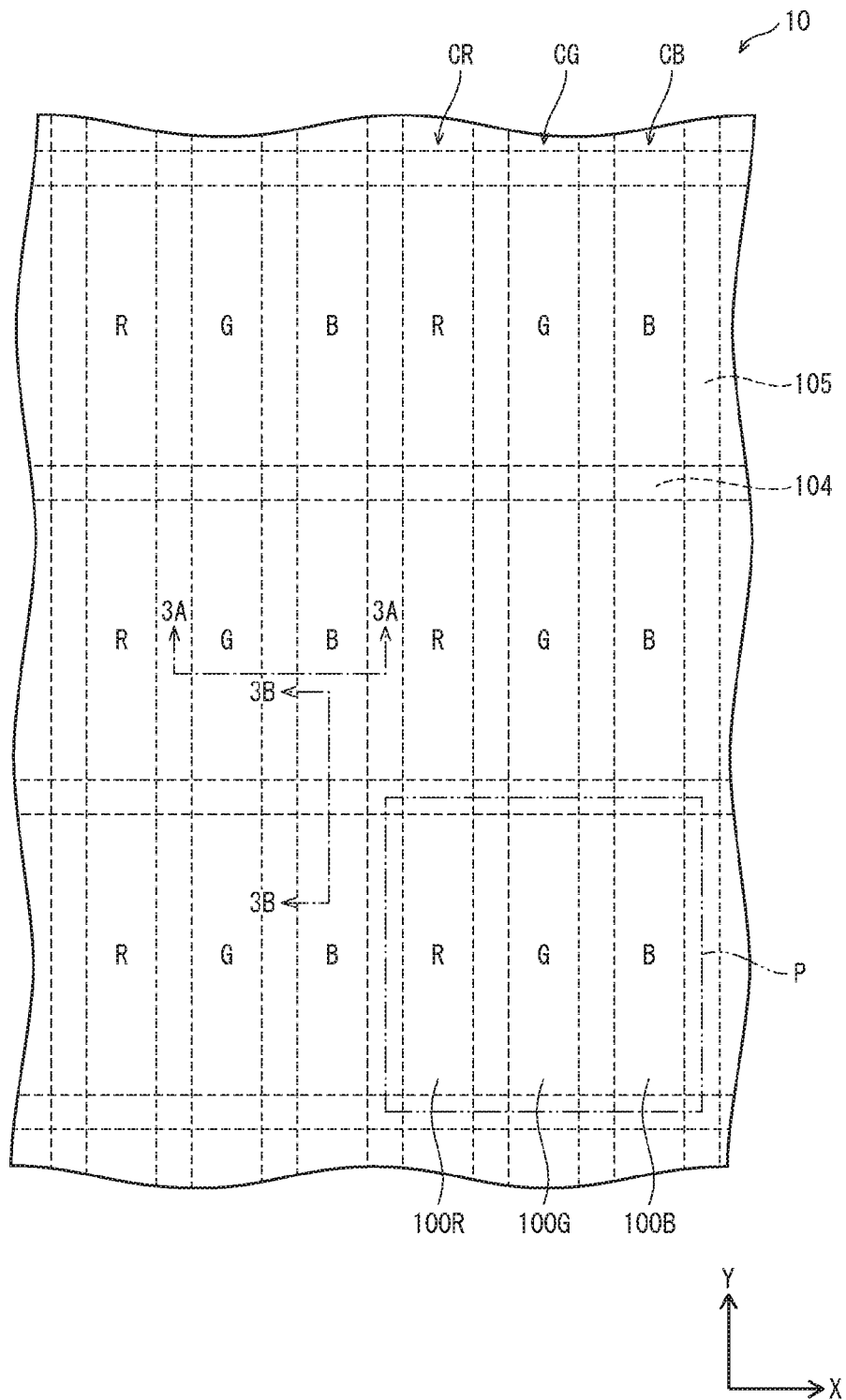
FIG. 2 is a schematic plan view diagram of a magnified portion of an image display face of the organic electroluminescence display panel 10.

FIG. 2 is a schematic plan view of a magnified portion of the image display face of the panel 10. Sub-pixels 100R, 100G, and 100B are arranged in a matrix on the panel 10, for example, and respectively emit light in red, green, and blue. The sub-pixels 100R, 100G, and 100B are aligned in alternation along the X direction. A group of the sub-pixels 100R, 100G, and 100B aligned in the X direction configures a single pixel P. The pixel P is capable of full color representation by combining emitted light brightness of the sub-pixels 100R, 100G, and 100B, subject to tone control.

In addition, each line in the Y direction is composed of only sub-pixels (the sub-pixels 100R, the sub-pixels 100G, or the sub-pixels 100B) of the same color, thus forming a sub-pixel column CR, a sub-pixel column CG, and a sub-pixel column CB. As a result, on the panel 10 as a whole, pixels P are arranged in a matrix along the X direction and the Y direction. The image is displayed on the image display face by combining the emitted colors of the pixels P arranged in this matrix.

Organic electroluminescence elements respectively emitting red, green, and blue light are disposed in the sub-pixels 100R, 100G, and 100B. The light emitted by the sub-pixels 100R, 100G, and 100B may have the color of emitted of light of the organic electroluminescence elements themselves. Also, the color of the light emitted by the organic electroluminescence elements may be corrected by a color filter.

The panel 10 employs a line bank scheme, for example. That is, a partition wall 105 shaped to partition each of the sub-pixel columns CR, CG, and CB is formed in plurality with spacing in the X direction. In the sub-pixel columns CR, CG, and CB, the sub-pixels 100R, 100G, and 100B share an organic light-emitting layer. However, a pixel insulation layer 104 insulating adjacent sub-pixels of the same color (adjacent sub-pixels 100R, adjacent sub-pixels 100G, and adjacent sub-pixels 100B) from each other is disposed in plurality with spacing in the Y direction. This enables each of the sub-pixels of the same color (each of the sub-pixels 100R, each of the sub-pixels 100G, and each of the sub-pixels 100B) to emit light independently. FIG. 2 illustrates the pixel insulation layers 104 and the partition walls 105 in dotted lines. This signifies that the pixel insulation layers 104 and the partition walls 105 are not exposed on the surface of the image display face, being instead arranged inside the image display face.

(2) Cross-Sectional Configuration

Figure 3A:
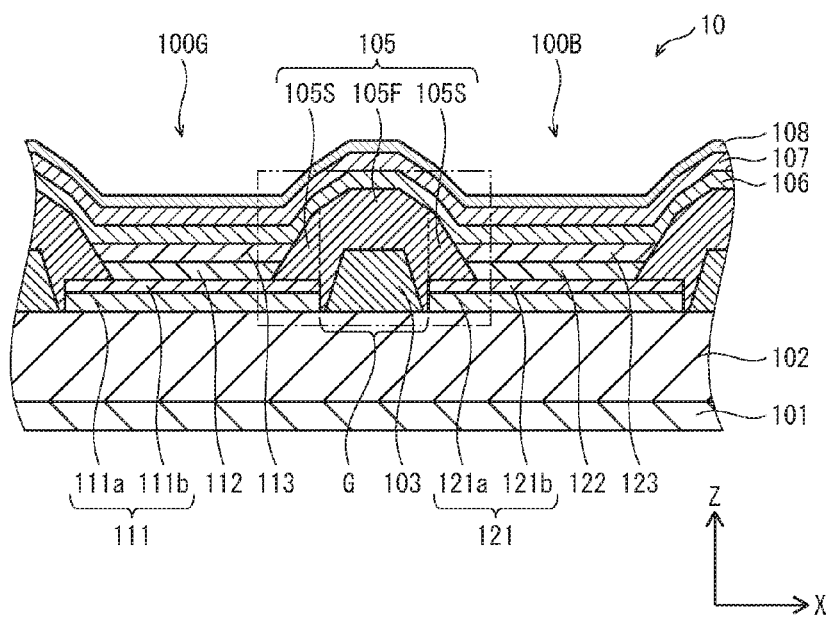
FIG. 3A is a schematic cross-sectional diagram taken along line 3A-3A of FIG. 2.
Figure 3B:
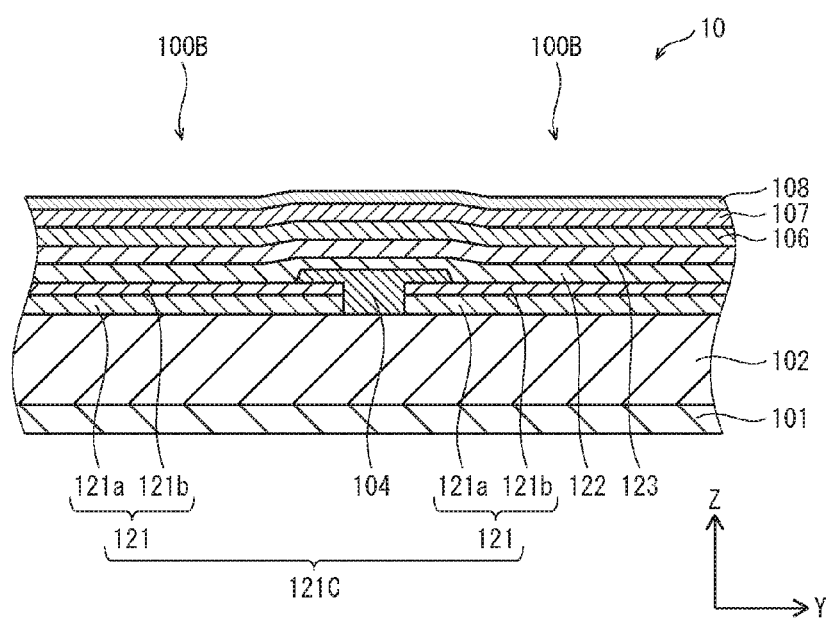
FIG. 3B is a schematic cross-sectional diagram taken along line 3B-3B of FIG. 2.

FIG. 3A is a schematic cross-sectional diagram taken along line 3A-3A of FIG. 2. FIG. 3B is a schematic cross-sectional diagram taken along line 3B-3B of FIG. 2. FIG. 3A is centered on the cross-sectional configuration of sub-pixel 100G and sub-pixel 100B. FIG. 3B illustrates the cross-sectional configuration of sub-pixel column CB. Note that the sub-pixel 100R also has a configuration similar to those illustrated in FIG. 3A, and the sub-pixel columns CR and CG also have a configuration similar to that illustrated in FIG. 3B. Also, in FIGS. 3A and 3B, the top of the page is oriented in the Z direction.

The panel 10 is equipped with a substrate 101, a first lower electrode 111 and a second lower electrode 121 disposed on the top face of the substrate 101 with a gap G therebetween in the X direction, and the partition wall 105 separating the space above the first lower electrode 111 from the space above the second lower electrode 121. Accordingly, the X direction corresponds to a first direction of the present embodiment. The term first direction X is also used below. In addition, the panel 10 is equipped with a first organic light-emitting layer 113 and a second organic light-emitting layer 123 which are respectively arranged on the top of the first lower electrode 111 and on the top of the second lower electrode 121 and are partitioned by the partition wall 105. Further, the panel 10 is equipped with an upper electrode 107 is arranged above the first organic light-emitting layer 113 and the top of the second organic light-emitting layer 123.

Figure 4:
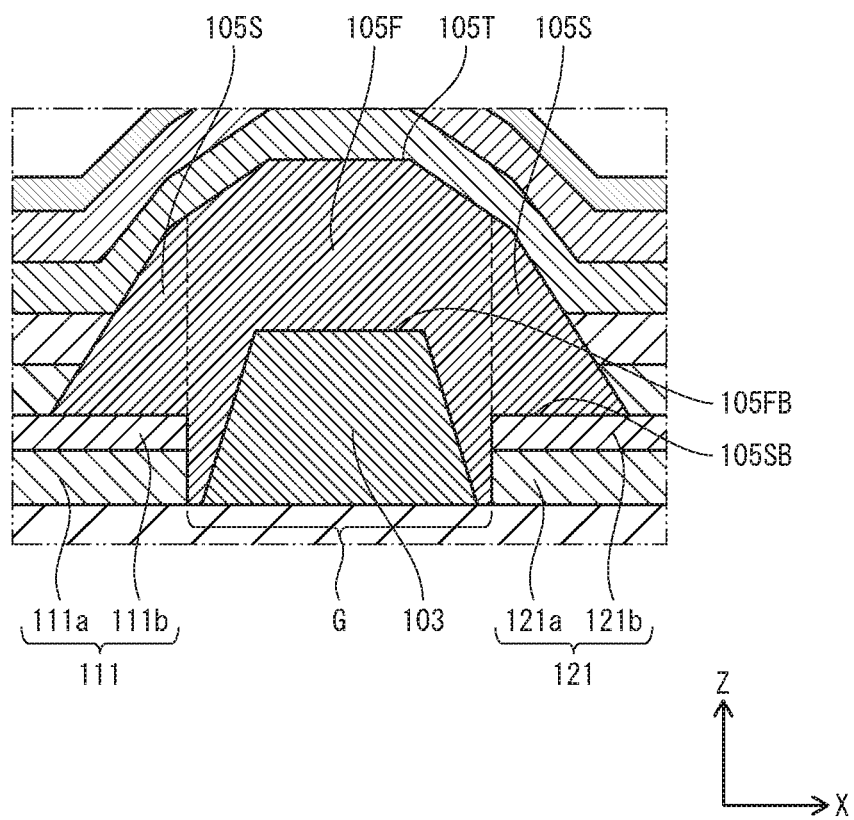
FIG. 4 is a magnified view of the double-chained portion of FIG. 3A.

Here, as illustrated in FIG. 4, which is a magnification of the double-chained portion of FIG. 3A, the partition wall 105 includes a first portion 105F above the gap G, and second portions 105S neighboring the first portion 105F on both sides in the first direction X, disposed over the first lower electrode 111 and over the second lower electrode 121. The dashed lines in FIG. 3A and FIG. 4 represent the boundaries of the first portion 105F and the second portions 105S. Furthermore, in the panel 10, at least part of a bottom face 105FB of the first portion 105F is positioned higher than bottom faces 105SB of the second portions 105S.

In addition, the panel 10 is also equipped with an inter-layer insulation layer 102 disposed over the substrate 101 and having a top face shaped in conformity with the top face of the substrate 101. Further, the panel 10 is equipped with a convex layer 103 having greater thickness than the first lower electrode 111 and the second lower electrode 121 and provided between the inter-layer insulation layer 102 and the first portion 105F. The first lower electrode 111, the second lower electrode 121, and the convex layer 103 are disposed over the inter-layer insulation layer 102. In addition, the panel 10 is equipped with a first hole transport layer 112 and a second hole transport layer 122 respectively disposed between the first lower electrode 111 and the first organic light-emitting layer 113, and between the second lower electrode 121 and the second organic light-emitting layer 123. Further, the panel 10 is equipped with an electron transport layer 106 disposed between the upper electrode 107 and the pair of the first organic light-emitting layer 113 and the second organic light-emitting layer 123, and a thin film sealing layer 108 arranged over the upper electrode 107. Also, as illustrated in FIG. 2 and FIG. 3B, the panel 10 is equipped with the pixel insulation layer 104 shaped to extend along the first direction X, between pairs of the first lower electrode 111 and between pairs of the second lower electrode 121.

In the above description, the numbers first and second applied to the lower electrodes, the hole transport layers, and the organic light-emitting layers are used for convenience, in order to distinguish between neighboring electrodes and layers in the first direction X. Accordingly, the terms first and second do not correspond one-to-one to pairs of the sub-pixels 100G and 100B. The first components may correspond to the sub-pixels 100R and 100B, and the second components may correspond to the sub-pixels 100R and 100G. Also, in the following description, the terms lower electrodes 111, 121, hole transport layers 112, 122, and organic light-emitting layers 113, 123 are also used in situations where there is no need to distinguish between the first and second components.

(3) Description of Components a. Substrate 101

The substrate 101 is a flat, rectangular plate and serves as a support member supporting the panel 10. Here, a thin film transistor (hereinafter, TFT) layer is formed over the substrate 101, but is not illustrated in the drawings.

An electrically insulating material is used in the substrate 101, for example. Specific examples of such a material include glass materials such as non-alkali glass, soda glass, non-fluorescent glass, phosphate glass, borate glass, quartz glass, and so on, resin materials such as acrylic resin, styrene resin, polycarbonate resin, epoxy resin, polyethylene resin, polyester resin, polyimide resin, silicone resin, and so on, and metal oxide materials such as aluminum oxide. The substrate 101 may also have a multilayer structure in which a layer of electrically insulating material is laminated over a layer of metal material such as aluminum, stainless steel, and so on.

Given that organic electroluminescence elements typically degrade upon reacting with water, oxygen, and so on, the substrate 101 beneficially has low permeability to water. As such, a glass material, a metal material, and so on are beneficially used. Also, in a situation where a resin material is used for the substrate 101, a multilayer structure is beneficially used such that a layer having low permeability to water, such as silicon nitride, silicon oxide, aluminum oxide, and the like, is layered over the resin material.

An electronic circuit controlling electric power supply to the organic electroluminescence element is disposed in the TFT layer. The TFT layer includes laminated layers, namely a semiconductor layer, a conductive layer, an electrically insulating layer, and so on, as well as electronic circuit elements such as a TFT element, a condenser element, wiring, and the like. In addition, a topmost portion of the TFT layer is made from a material that is electrically insulating and has low permeability to water, such as silicon nitride, aluminum oxide, or the like. A passivization layer may also be disposed thereon so as to entirely cover the electronic circuit elements of the TFT layer.

b. Inter-Layer Insulation Layer 102

The inter-layer insulation layer 102 is made from a resin material, is disposed over the substrate 101, which includes the TFT layer, and serves to electrically insulate the electronic circuit elements of the TFT layer, the organic electroluminescence elements, and so on. In addition, the inter-layer insulation layer 102 also serves to fill irregularities on the substrate 101 caused by the TFT layer. The top face of the inter-layer insulation layer 102 is planarized in conformity with the top face of the substrate 101.

Specific examples of the resin material used for the inter-layer insulation layer 102 include acrylic resin, polyimide resin, silicone resin, phenolic resin, and other electrically insulating materials susceptible to patterning.

c. Convex Layer 103

The convex layer 103 is a layer substantially shaped as a truncated square pyramid, disposed over the inter-layer insulation layer 102. The material used for the convex layer 103 is, for example, an electrically insulating material. Specific examples of such a material include the resin materials listed for the inter-layer insulation layer 102, as well as inorganic materials such as silicon nitride, silicon oxide, silicon oxinitride, aluminum oxide, and so on. The inter-layer insulation layer 102 and the convex layer 103 are beneficially formed from the same resin material, as described later.

Here, the thickness of the convex layer 103 is greater than the respective thicknesses of the first lower electrode 111 and the second lower electrode 121. Due to this difference in thickness, the foundation of the partition wall 105, made up of the first lower electrode 111, the second lower electrode 121, and the convex layer 103, is shaped such that a part of the foundation below the first portion 105F protrudes upward with respect to parts of the foundation below the second portions 105S. As a result, in the panel 10, at least part of the bottom face 105FB is raised above the bottom faces 105SB.

Also, as illustrated in FIG. 5, which is a schematic perspective view diagram illustrating a state prior to formation of the partition wall 105, the convex layer 103 is shaped so as to extend in the Y direction, which intersects the first direction X along the top face of the substrate 101. Here, the Y direction corresponds to a second direction of the present embodiment. The term second direction Y is also used below. The convex layer 103 is shaped so as to extend along the above-described Y direction. As such, in the panel 10, a part of the foundation below the first portion 105F protrudes upward with respect to parts of the foundation below the second portions 105S at any area along the second direction Y. As a result, in the panel 10, at least part of the bottom face 105FB is higher than the bottom faces 105SB, in any lateral cross-section of the partition wall 105 taken along the second direction Y. Here, given a shape extending in one direction, the lateral cross-section refers to a cross-section taken perpendicularly with respect to the direction of extension.

d. Pixel Insulation Layer 104

The pixel insulation layer 104 is made from an electrically insulating material. As illustrated in FIG. 3B, the pixel insulation layer 104 covers end portions of neighboring electrodes (neighboring first lower electrodes 111 or neighboring the second lower electrodes 121) within each of the sub-pixel columns CR, CG, and CB, and is shaped so as to partition the neighboring electrodes from one another. Specifically, as illustrated in FIG. 5, the pixel insulation layer 104 is shaped so as to extend along the first direction X between neighboring electrodes (neighboring first lower electrodes 111 and neighboring the second lower electrodes 121). In addition, the thickness of the pixel insulation layer 104 is greater than the thickness of the first lower electrode 111 and the second lower electrode 121, and less than the thickness of the convex layer 103. Accordingly, the hole transport layers 112, 122 and the organic light-emitting layers 113, 123 in the sub-pixel columns CR, CG, and CB are not partitioned by the pixel insulation layer 104, which is thinner than the partition wall 105, and the flow of ink during formation of the hole transport layers 112, 122 and the organic light-emitting layers 113, 123 is not obstructed.

According to the above-described configuration, the pixel insulation layer 104 serves to constrain tier cutting in the hole transport layers 112, 122 and the organic light-emitting layers 112, 123 in the sub-pixel columns CR, CG, and CB while improving the electrical insulation between neighboring electrodes (neighboring first lower electrodes 111 and neighboring the second lower electrodes 121), to improve the electrical insulation between the lower electrodes 111, 121 and the upper electrode 107, and so on.

Specific examples of the electrically insulating material used for the pixel insulation layer 104 include the resin materials and inorganic materials listed for the convex layer 103. Also, in order to facilitate the flow and spread of ink during formation of the hole transport layers 112, 122, the surface of the pixel insulation layer 104 is beneficially lyophilic with respect to ink.

e. First Lower Electrode 111 and Second Lower Electrode 121

The lower electrodes 111, 121 are arranged over the substrate 101 in a matrix made up of the first direction X and the second direction Y, and serve as anodes supplying holes to the organic light-emitting layers 113, 123, respectively. Specifically, the lower electrodes 111, 121 are flat, rectangular members disposed over the inter-layer insulation layer 102 and neighboring both sides of the convex layer 103 in the first direction X. Also, the lower electrodes 111, 121 define the positions of the organic electroluminescence elements, and are in one-to-one correspondence with the sub-pixels 100R, 100G, and 100B. As illustrated in FIG. 5, in the panel 10, the first lower electrode 111 and the second lower electrode 121 are each provided in plurality. The plurality of the first lower electrodes 111 are aligned in the second Y direction, thus forming a first lower electrode column 111C. Similarly, the plurality of the second lower electrodes 121 are aligned in the second Y direction, thus forming a second lower electrodes column 121C. In situations where there is no particular need to distinguish between the first lower electrode column 111C and the second lower electrode column 121C, the term lower electrode columns 111C, 121C is used below.

Each of the lower electrodes 111, 121 has a two-layer configuration of different materials. Specifically, the lower electrode 111 is composed of a first metal layer 111a made of a metal material on a lower side, and a first oxide layer 111b made of a metal oxide material on an upper side. Similarly, the lower electrode 121 is composed of a second metal layer 121a made of a metal material on a lower side, and a second oxide layer 121b made of a metal oxide material on an upper side.

Specific examples of the metal material used for the first metal layer 111a and the second metal layer 121a include aluminum (Al), silver (Ag), molybdenum (Mo), tungsten (W), titanium (Ti), chromium (Cr), nickel (Ni), zinc (Zn), copper (Cu), gold (Au), platinum (Pt), palladium (Pd), and so on. The metal material may also be a metal alloy combining a plurality of metal materials, and may be a layered material combining a metal and a metal alloy.

For considerations of hole supply, a material having a high work function is beneficially used for the first metal layer 111a and the second metal layer 121a. Also, given that the panel 10 is a top emission panel, the first metal layer 111a and the second metal layer 121a are beneficially optically reflective.

Specific examples of metal oxide materials used for the first oxide layer 111b and the second oxide layer 121b include oxides of Ag, Mo, Cr, W, Ni, vanadium (V), iridium (Ir), and so on. The presence of the first oxide layer 111b and the second oxide layer 121b serves to lower the energy bather for hole supply (i.e., hole injection) from the lower electrodes 111, 121 to the organic light-emitting layers 113, 123, respectively, and to improve the efficiency of hole injection. That is, the first oxide layer 111b and the second oxide layer 121b serve as hole injection layers.

However, the lower electrodes 111, 121 are not limited to the above-described configuration. For example, the lower electrodes 111, 121 may respectively include only the first metal layer 111a and the second metal layer 121a, and may further include additional layers having different functions. For instance, a layer of transparent, conductive oxide material, such as indium tin oxide (ITO), indium zinc oxide (IZO), and so on, may be disposed between the first metal layer 111a and the first oxide layer 111b and between the second metal layer 121a and the second oxide layer 121b in order to improve adhesion and prevent oxidation of the metal material. Also, for example, a barrier metal layer made from a metal oxide material, such as tungsten oxide, may be disposed below the first metal layer 111a and the second metal layer 121a in order to constrain corrosion during wet etching and to constrain the dispersion of hydrogen to the lower layers.

In addition, a layer of conductive oxide material, such as ITO and IZO, and a layer of conductive carbon material, such as graphite, carbon nanotube, and so on, may be disposed instead of each of the first metal layer 111a and the second metal layer 121a.

f. First Hole Transport Layer 112 and Second Hole Transport Layer 122

The hole transport layers 112, 122 are respectively disposed over the lower electrodes 111, 121, and serve to improve the transport of the holes supplied by the lower electrodes 111, 121 to the organic light-emitting layers 113, 123, respectively. In addition, the hole transport layers 112, 122 are formed in using a wet process in regions partitioned by the partition wall 105. As illustrated in FIG. 3B, each hole transport layers 112, 122 are shaped so as to extend along the second direction Y above the lower electrode columns 111C, 121C and over the pixel insulation layer 104. As a result, sub-pixels (sub-pixels 100R, sub-pixels 100G, or sub-pixels 100B) in each sub-pixel column (sub-pixel column CR, sub-pixel column CG, and sub-pixel column CB) share the same hole transport layer (hole transport layer 112 or hole transport layer 122). Also, for considerations of light-emission efficacy, drive voltage optimization, and so on, the hole transport layers 112, 122 may have thicknesses that vary among the sub-pixel columns CR, CG, and CB.

An organic material having high hole mobility is used, for example, as the material for the hole transport layers 112, 122. Specific examples of such a material include triazole derivative, oxadiazole derivative, imidazole derivative, polyarylalkane derivative, pyrazoline derivative, pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, triphenylmethane derivative, and tetraphenylbenzene derivative (all disclosed in Japanese Patent Application Publication No. H5-163488). In addition, the hole transport layers 112, 122 may be compound layers combining the above-described materials and other materials. Also, for considerations of light-emission efficacy, drive voltage optimization, and so on, the hole transport layers 112, 122 may use different materials among the sub-pixel columns CR, CG, and CB.

g. First Organic Light-Emitting Layer 113 and Second Organic Light-Emitting Layer 123

The organic light-emitting layers 113, 123 include an organic light-emitting material and are respectively disposed over the hole transport layers 112, 122. Light emission (i.e., electroluminescence) occurs through the recombination of electrons with the holes supply by the lower electrodes III, 121 and the upper electrode 107 in the organic light-emitting layers 113, 123. In addition, the organic light-emitting layers 113, 123 are formed in using a wet process in regions partitioned by the partition wall 105. As illustrated in FIG. 3B, the organic light-emitting layers 113, 123 are shaped so as to extend along the second direction Y above the first lower electrode column 111C and the second lower electrode column 121C. As a result, As a result, sub-pixels (sub-pixels 100R, sub-pixels 100G, or sub-pixels 100B) in each sub-pixel column (sub-pixel column CR, sub-pixel column CG, and sub-pixel column CB) share the same organic light-emitting layer (organic light-emitting layer 113 or organic light-emitting layer 123). However, the organic light-emitting layers 113, 123 are also capable of independent light emission in each portion above the lower electrodes 111, 121, that is, in each of the sub-pixels 100R, 100G, and 100B. Also, for considerations of light-emission efficacy, drive voltage optimization, and so on, the organic light-emitting layers 113, 123 may have thicknesses that vary among the sub-pixel columns CR, CG, and CB.

The organic light-emitting material in the organic light-emitting layers 113, 123 may be one of a low-molecular material and a high-molecular material. Specific examples of the organic light-emitting material include fluorescent materials and phosphorous materials, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, and rare earth metal complex (all disclosed in Japanese Patent Application Publication No. H5-163488).

The organic light-emitting layers 113, 123 may also be compound layers combining the organic light-emitting material and another material. Here, a three-color divided application scheme is used for the panel 10, in which the organic light-emitting layers 113, 123 include an organic light-emitting material respectively emitting red, green, and blue light for each of the sub-pixel columns CR, CG, and CB. Accordingly, the first organic light-emitting layer 113 and the second organic light-emitting layer 123 neighboring each other in the first direction X emit light of different colors.

h. Partition Wall 105

The partition wall 105 is a wall-shaped member having the lower electrodes 111, 121 and the convex layer 103 as foundation layers, and disposed in correspondence with each gap G (convex layer 103). The partition wall 105 is shaped as a partition between the first hole transport layer 112 and the second hole transport layer 112, and between the first organic light-emitting layer 113 and the second organic light-emitting layer 123, all of which being formed by the wet process. The partition wall 105 serves to constrain ink running in the first direction X during the manufacturing process. The partition wall 105 also serves to electrically insulate neighboring hole transport layers 112, 122 and neighboring organic light-emitting layers 113, 123 in the first direction X from one another.

Furthermore, the partition wall 105 is shaped so as to extend in the second direction Y between neighboring sub-pixel columns CR, CG, and CB in the first direction X as illustrated in FIG. 2, and more specifically between the first organic light-emitting layer 113 and the second organic light-emitting layer 123 as illustrated in FIG. 3A. That is, the partition wall 105 has a line bank shape.

An electrically insulating material is used for the partition wall 105. Specific example of the electrically insulating material include the resin materials and inorganic materials listed for the convex layer 103. When using a resin material, a photosensitive material is beneficial for considerations of workability. The photosensitive material may be one of positive and negative, the latter being beneficial. The partition wall 105 may also be a compound layer combining the above-described electrically insulating material and another material, and may be have a multi-layer structure combining layers of the above-listed materials.

The partition wall 105 is beneficially resistant to organic solvents and to heat. Also, in order to constrain ink running, a surface of the partition wall 105 is beneficially liquid-repellent. For example, one of using a liquid-repellent material for the partition wall 105 and applying a surface process to make the partition wall 105 liquid repellent is beneficially employed.

As described above, in the panel 10, at least a part of the bottom face 105FB is positioned higher than the bottom faces 105SB. As a result, in the panel 10, sinking of the top face 105T of the first portion 105F of the partition wall 105 is constrained during the formation of the partition wall 105. Accordingly, the panel 10 has a structure in which ink is unlikely to run during the formation of the first organic light-emitting layer 113 and the second organic light-emitting layer 123, which makes for stable product quality.

Also, in the panel 10, at least a part of the bottom face 105FB is positioned higher than the bottom faces 105SB, in any lateral cross-section of the partition wall 105 along the second direction Y. As a result, sinking of the top face 105T of the first portion 105F of the partition wall 105 is constrained during the formation of the partition wall 105. Accordingly, the panel 10 has a structure along the second direction Y in which ink is unlikely to run during the formation of the first organic light-emitting layer 113 and the second organic light-emitting layer 123, which makes for more stable product quality.

i. Electron Transport Layer 106

The electron transport layer 106 is disposed over the organic light-emitting layers 113, 123. The electron transport layer 106 serves to improve the transport of the electrons supplied by the upper electrode 107 to the organic light-emitting layers 113, 123. As illustrated in FIGS. 3A and 3B, the electron transport layer 106 is also disposed over the partition wall 105, so as to be a continuous layer shared by the sub-pixels 100R, 100G, and 100B.

An organic material having high electron mobility, for example, is used for the electron transport layer 106. Specific examples of such a material include nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, and quinolone complex derivative (all disclosed in Japanese Patent Application Publication No. H5-163488), as well as phosphorous oxide derivative, triazole derivative, triazine derivative, silole derivative, dimesityl boron derivative, and triaryl boron derivative. In addition, the electron transport layer 106 may be a compound layer combining the above-described materials and other materials.

j. Upper Electrode 107

The upper electrode 107 is disposed over the organic light-emitting layers 113, 123, specifically so as to cover the electron transport layer 106, and serves as a cathode supplying electrons to the organic light-emitting layers 113, 123.

A conductive material is, for example, used for the upper electrode 107. Specific examples of such a material include the materials listed for the lower electrodes 111, 121. For electron supply considerations, a material having a low work function is beneficially used for the upper electrode 107. In addition, the upper electrode 107 beneficially has high optical transmittance given that the panel 10 is a top emission panel. Also, imparting optical reflectivity to the lower electrodes 111, 121 as well as the upper electrode 107 and forming a resonator structure enables improved wavelength selectivity for emitted light and improvements to color purity for the light emitted by the sub-pixel 100R, 100G, 100B.

k. Thin Film Sealing Layer 108

The thin film sealing layer 108 entirely covers the top face of the substrate 101 (inter-layer insulation layer 102) on which the above-described components are arranged, and serves to protect the components from physical shocks, atmospheric water, oxygen, and so on. A material having low permeability to water, for example, is used for the thin film sealing layer 108. Specific examples of such a material include inorganic materials such as silicon nitride, silicon oxide, carbon oxide, carbon nitride, aluminum oxide, and so on. Also, given that the panel 10 is a top emission panel, a material having high optical transmittance and a small difference in refractive index relative to the upper electrode 107 is beneficially used for the thin film sealing layer 108.

3. Manufacturing Method of Panel 10

(1) Overall Process

An overall process concerning a manufacturing method for the panel 10, which is an embodiment of the disclosure, is described below. FIGS. 6A to 6C, 7A to 7C, and 8A to 8C are schematic cross-sectional diagrams illustrating the manufacturing method of the panel 10. The cross-sections illustrated in FIGS. 6A to 6C, 7A to 7C, and 8A to 8C correspond to the cross-section illustrated in FIG. 3A.

a. Substrate Preparation

First, the substrate 101 is prepared. Specifically, an electrically insulating material is shaped into a flat plate and used as the substrate 101. In addition, the TFT layer and the passivization layer, where necessary, are formed on the substrate 101 at this time.

Specifically, for example, a layer of semiconductor material and a layer of one of an electrically conducting material and an electrically insulating material are first formed over the substrate 101. The formation method used for these layers may be, for example, a dry process such as vacuum deposition, electron beam deposition, ion plating, sputtering, and vapor phase epitaxy, and a wet process such as printing, spin coating, inkjet, dispensing, die coating, and slit coating, in accordance with the material of each layer.

Here, patterning may be performed as needed, such that the above-described layers have a predetermined shape. The patterning method may involve, for example, arranging a metal mask or a print mask to cover unnecessary portions during layer formation and forming the above-described layers only at necessary positions. Also, the patterning method may be a combination of dry etching and wet etching, a photolithography method, or the like, performed in order to remove unnecessary portions after the above-described layers have been formed.

In addition, plasma injection, ion injection, baking, and other processes may be performed on the formed layers as needed.

The TFT layer may be formed through repeated formation of the above-described layers to form a laminated structure configuring predetermined electronic circuits. Furthermore, the passivization layer may be formed so as to cover the substrate 101 on which the TFT layer is formed, as necessary. The above-described examples of wet processes and dry processes may be used to form the passivization layer, in accordance with the materials. Also, the above-described examples of patterning method may be used in a situation where openings (contact holes) are formed at predetermined positions in the passivization layer in order to electrically connect TFT elements of the TFT layer and the lower electrodes 111, 121.

b. Inter-Layer Insulation Layer Formation

Figure 6A:
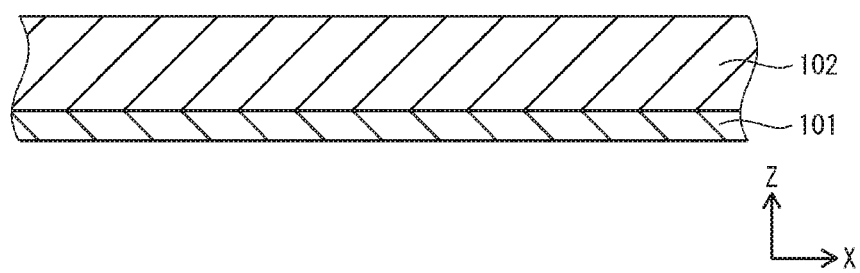
FIGS. 6A 6B, and 6C are schematic cross-sectional diagrams illustrating a manufacturing process of the organic electroluminescence display panel 10, where

Next, as illustrated in FIG. 6A, a resin material is used to form the inter-layer insulation layer 102 over the substrate 101, with a top face having a shape that conforms to the top face of the substrate 101. Specifically, a resin material having a fixed fluidity is applied along the top face of the substrate 101 using, for example, die coating, so as to fill irregularities on the substrate 101 caused by the (non-diagrammed) TFT layer. As a result, the top face of the inter-layer insulation layer 102 is planarized along the top face of the substrate 101. Also, the above-described examples of the patterning method may be used in a situation where openings (contact holes) are formed at predetermined positions in the inter-layer insulation layer 102, similarly to the passivization layer.

c. Convex Layer Formation

Figure 6B:
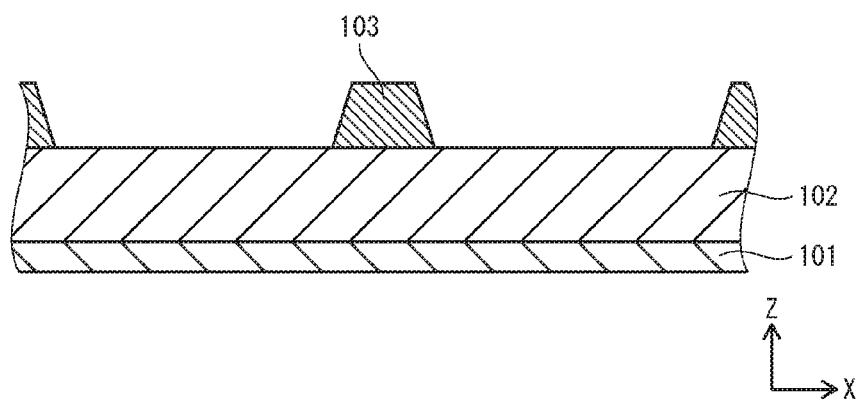

Next, as illustrated in FIG. 6B, an electrically insulating material is used to form the convex layer 103 over the inter-layer insulation layer 102, in a shape extending in the second direction Y. The specific formation method is described later.

d. Lower Electrode Formation

Figure 6C:
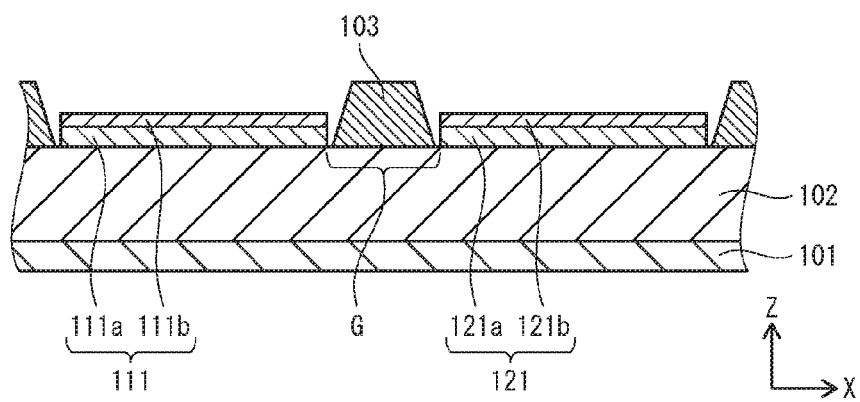

Next, as illustrated in FIG. 6C, the first lower electrode 111 and the second lower electrode 121 are formed over the substrate 101, arranged on the top face of the substrate 101 with the gap G therebetween in the first direction. This involves forming the first lower electrode 111 and the second lower electrode 121 over the inter-layer insulation layer 102, each at a different side of the convex layer 103 in the first direction X. In addition, as illustrated in FIG. 5, the formation of the lower electrodes 111, 121 involves forming the first lower electrode 111 and the second lower electrode 121 in plurality along the second direction Y, thus forming the first lower electrode column 111C and the second lower electrode column 121C.

Specifically, for example, a metallic thin film is first formed over the inter-layer insulation layer 102 and over the convex layer 103, from the material of the first metal layer 111a and the second metal layer 121a using a sputtering method. Afterward, a thin film of metal oxide material is formed over the metallic thin film from the material of the first oxide layer 111b and the second oxide layer 121b, using a reactive sputtering method. Here, film formation conditions are adjusted such that the total thickness of the metallic thin film and the metal oxide film is less than the thickness of the convex layer 103. Next, a photoresist material is applied to the top of the metal oxide film and patterning is subsequently performed using photolithography on the photoresist material. This photoresist material remains over the film of metallic oxide in portions corresponding to the sub-pixels 100R, 100G, and 100B at both sides of the convex layer 103 in the first direction X. A dry etching method and a wet etching method are then used in the stated order to perform continuous etching of the metallic thin film and the film of metal oxide where the photoresist material is not disposed. Finally, washing is performed using an appropriate washing liquid to remove the photoresist material and any dross produced by the etching and so on. According to the above, the first lower electrode 111 and the second lower electrode 121, respectively including the first metal layer 111a and the second metal layer 121a laminated with the first oxide layer 111b and the second oxide layer 121b, are formed at predetermined positions, thus enabling the formation of the first lower electrode column 111C and the second lower electrode column 121C.

Here, performing continuous etching on the metallic thin film and the film of metal oxide as described above imparts efficiency to the manufacturing process. Also, using a single photoresist for patterning both films improves the formation precision for the first lower electrode 111 and the second lower electrode 121.

Further, in a situation where a barrier metal layer is disposed below the first metal layer 111a and the second metal layer 121a, then in the above, the film of metal oxide is formed before the formation of the metallic thin film and dry etching of the film of metal oxide is further performed after wet etching of the metallic thin film. In addition, the formation of the lower electrodes 111, 121 is not limited to continuous etching of the metallic thin film and the film of metal oxide. The first oxide layer 111b and the second oxide layer 121b may also be formed after the formation of the first metal layer 111a and the second metal layer 121a.

In the present manufacturing method, the first lower electrode 111 and the second lower electrode 121 are formed more thinly than the convex layer 103. As a result, the lower electrodes 111, 121 and the convex layer 103 having greater thickness than the lower electrodes 111, 121 are formed prior to forming the partition wall 105, as foundations for the partition wall 105. That is, a part of the foundation of the partition wall 105 corresponding to the gap G protrudes upward. The respective thicknesses of the lower electrodes 111, 121 and of the convex layer 103 may be determined as appropriate in accordance with the shape and specifications of the panel 10. For example, in a situation where the thickness of the lower electrodes 111, 121 is 250 nm, the thickness of the convex layer 103 is from 500 nm to 1000 nm.

e. Pixel Insulation Layer Formation

Figure 7A:
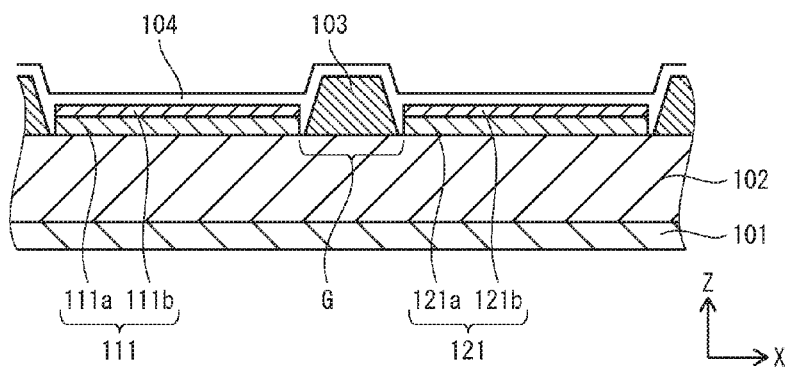
FIGS. 7A 7B, and 7C are schematic cross-sectional diagrams illustrating the manufacturing process of the organic electroluminescence display panel 10, where

Next, as illustrated in FIG. 7A, the pixel insulation layer 104 is formed between adjacent first lower electrodes 111 and adjacent second lower electrodes 121, to have a shape that extends in the first direction X and a thickness that is greater than the thickness of the lower electrodes 111, 121 and less than the thickness of the convex layer 103. However, it should be noted that the pixel insulation layer 104 is not formed at the position illustrated by the cross-section of FIG. 7A, but rather farther along the direction of page depth, relative to the illustrated cross-section. As such, in FIG. 7A, the surface of the pixel insulation layer 104 is illustrated without hatching to represent the pixel insulation layer 104 being formed farther along the direction of page depth. The same applies to FIG. 7B.

Specifically, the formation method used for the pixel insulation layer 104 may involve, for example, using die coating to apply a resin material over the top face of the substrate 101, on which components up to the lower electrodes 111, 121 are formed, at a thickness that is greater than the thickness of the lower electrodes 111, 121 and less than the thickness of the convex layer 103. Then, the pixel insulation layer 104 may be formed using a photolithography method to apply patterning to the resin material in a shape extending in the first direction X between adjacent first lower electrodes 111 and adjacent the second lower electrodes 121.

f. Partition Wall Formation

Figure 7B:
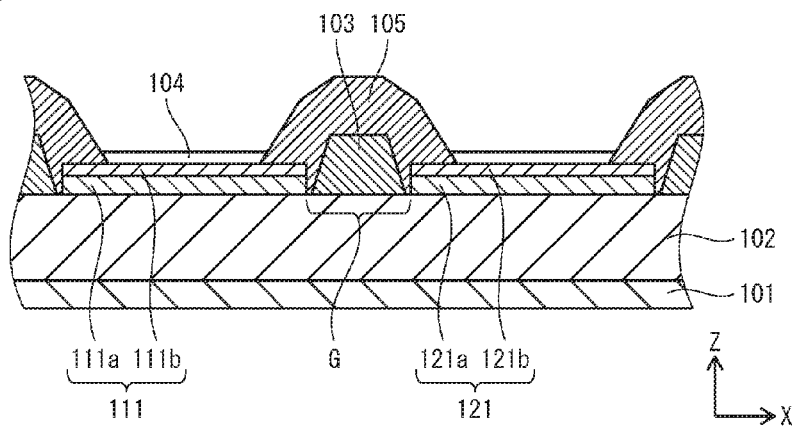

Next, as illustrated in FIG. 7B, the partition wall 105 is formed using an electrically insulating material, in a shape that separates the space above the first lower electrode 111 and the space above the second lower electrode 121 from one another. Here, as illustrated in FIG. 4, the partition wall 105 is formed in a shape having the first portion 105F above the gap G, and the second portions 105S, which neighbor the first portion 105F on both sides in the first direction X, disposed over the first lower electrode 111 and over the second lower electrode 121.

Specifically, the formation method for the partition wall 105 involves firstly using the die coat method to apply a resin material that includes a liquid-repellent component, such as a fluorine compound, on the top face of the substrate 101 on which components up to the pixel insulation layer 104 are formed, with a thickness that covers the top face of the convex layer 103 (i.e., the pixel insulation layer 104 over the convex layer 103). Subsequently, a photolithography method is used to pattern the resin material into a shape extending along the second direction Y over the gap G, leaving the resin material over the gap G and over ends of neighboring pairs of the first lower electrodes 111 and the second lower electrodes 121.

Furthermore, after patterning, the resin material may be cured using a hot air drying oven, a hot plate, an infra-red lamp, or the like to form the partition wall 105. The curing temperature and time may be set as appropriate in accordance with the resin material, and may be, for example, from 150° C. to 250° C. and from 30 minutes to 120 minutes. Curing improves adhesion with the foundation layers, increases film density, and enables the partition wall 105 to be formed with improved strength and resistance to organic solvents. In addition, curing displaces the liquid-repellent components toward the surface of the partition wall 105 and enables the partition wall 105 to be formed with an exceptionally liquid-repellent surface. Also, curing enables any dross remaining after development to be removed, increases top layer formation precision, and provides improvements to the quality of formation. Here, irradiating the entire top face of the substrate 101 with ultraviolet rays after curing enables the breakdown of any unnecessary liquid-repellent components and provides further top layer formation precision and improvements to the quality of formation.

In the present manufacturing method, as described above, an upwardly-protruding shape is formed in the foundation of the partition wall 105 at the positions corresponding to the gap G, prior to the formation of the partition wall 105. As such, at least a part of the bottom face 105FB is formed at a higher position than the bottom faces 105SB of the second portions 105S. As a result, in the present manufacturing method, performing curing during formation of the partition wall 105 enables sinking of the top face of the first portion 105F of the partition wall 105 to be constrained despite any shrinking.

Here, when using an inorganic material for the partition wall 105, a silicon oxide film may, for example, be formed using vacuum deposition or the like. In such a situation, a photolithography method, a metal mask, or the like may be used to pattern the resin material into a shape extending along the second direction Y over the gap G, leaving the resin material over the gap G and over ends of neighboring pairs of the first lower electrodes 111 and the second lower electrodes 121, so as to form the partition wall 105.

According to the present manufacturing method, at least a part of the bottom face 105FB is formed at a higher position than the bottom faces 105SB of the second portions 105S in this situation as well. As such, sinking of the top face of the partition wall 105 on the first portion 105F may be constrained despite the partition wall 105 being influenced by irregularities in the foundations.

g. Hole Transport Layer Formation

Figure 7C:
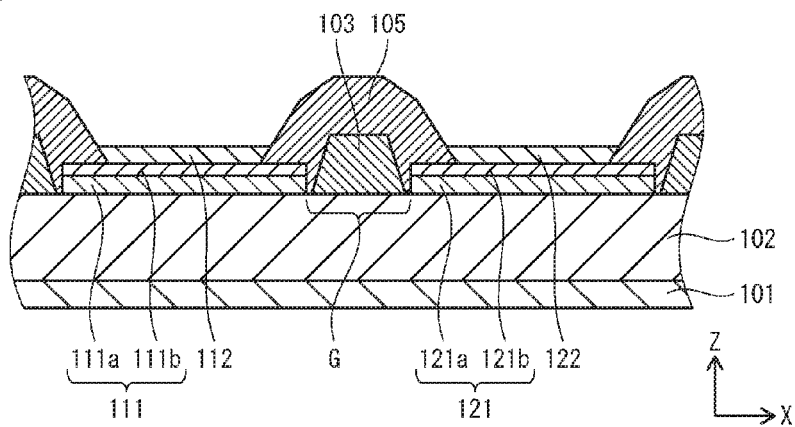

Next, as illustrated in FIG. 7C, the first hole transport layer 112 and the second hole transport layer 122 are respectively formed over the first lower electrode 111 and the second lower electrode 121, partitioned by the partition wall 105. Also, as illustrated in FIG. 3B, the hole transport layers 112, 122 are formed so as to extend along the second direction Y over the lower electrode columns 111C, 121C. Specifically, the formation method for the hole transport layers 112, 122 may be identical to that of the later-described organic light-emitting layers 113, 123.

h. Organic Light-Emitting Layer Formation

Next, the first organic light-emitting layer 113 and the second organic light-emitting layer 123 are respectively formed over the first lower electrode 111 and the second lower electrode 121 using a wet process, and are partitioned by the partition wall 105. Also, at this stage, as illustrated in FIG. 3B, the first organic light-emitting layer 113 and the second organic light-emitting layer 123 are respectively formed so as to extend along the second direction Y over the first lower electrode column 111C and the second lower electrode column 121C.

Figure 8A:
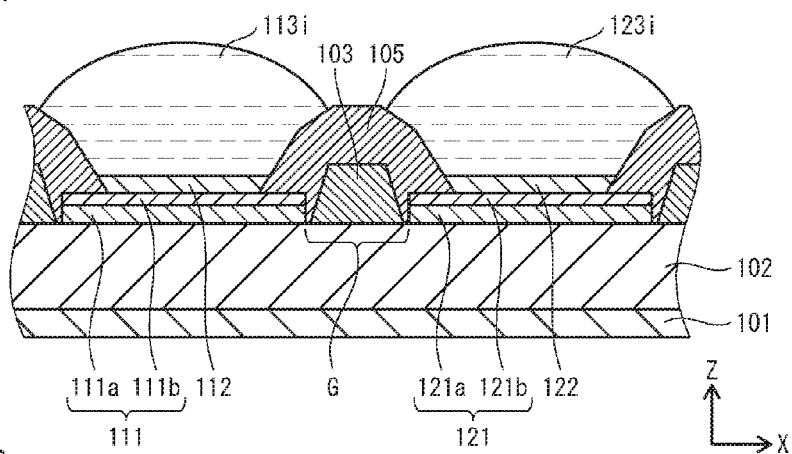
FIGS. 8A 8B, and 8C are schematic cross-sectional diagrams illustrating the manufacturing process of the organic electroluminescence display panel 10, where

Specifically, as illustrated in FIG. 8A, ink 113*i* and ink 123*i*, which include organic light-emitting materials of different light-emission colors, are first respectively applied over the first hole transport layer 112 and the second hole transport layer 122, which are partitioned by the partition wall 105, using an inkjet method, for example. Also, at this stage, each of the ink 113*i* and the ink 123*i* is applied so as to form a continuous film over the pixel insulation layer 104, spanning over corresponding ones of the lower electrodes (first lower electrodes 111 or second lower electrodes 121). As a result, the ink 113*i* and the ink 123*i* are able to flow along the second direction Y. This enables reductions in uneven application of the ink 113$i$, 123$i$.

As described above, the partition wall 105 formed in the present manufacturing method is constrained from top face sinking as illustrated in FIG. 4. The ink 113$i$ and the ink 123$i$ are thus unlikely to run over the partition wall 105. As a result, in the present manufacturing method, the formation precision of the organic light-emitting layers 113, 123 is improved, and the quality of the panel 10 is made stable.

Figure 8B:
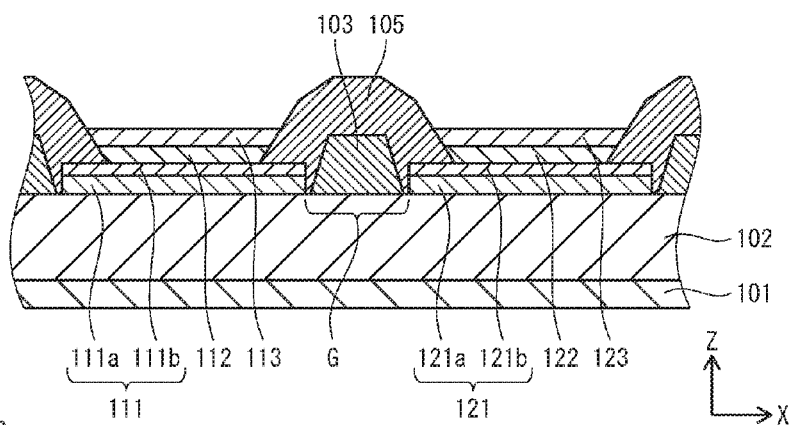

Subsequently, as illustrated in FIG. 8B, an organic solvent in the ink 113$i$, 123$i$ is evaporated by heating the substrate 101, after application of the ink 113$i$, 123$i$, by heating in a vacuum environment such as a vacuum chamber. Accordingly, the organic light-emitting layers 113, 123 are formed.

i. Electron Transport Layer and Upper Electrode Formation

Figure 8C:
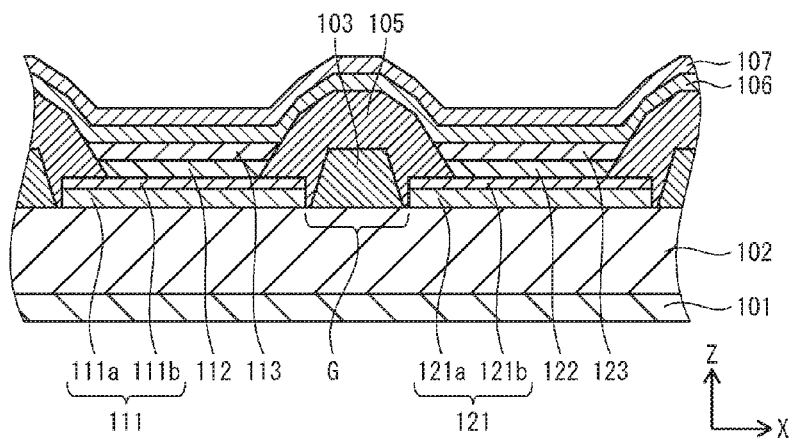

Next, as illustrated in FIG. 8C, the electron transport layer 106 and the upper electrode 107 are formed over the first organic light-emitting layer 113 and the second organic light-emitting layer 123. Specifically, for example, the electron transport layer 106 and the upper electrode 107 are formed over the entirety of the substrate 101 having the components up to the organic light-emitting layers 113, 123 formed thereon, using a dry process adapted to the materials of the electron transport layer 106 and the upper electrode 107.

j. Thin Film Sealing Layer Formation

Lastly, as illustrated in FIGS. 3A and 3B, the thin film sealing layer 108 is formed so as to cover the top face of the substrate 101 on which the components up to the upper electrode 107 have been formed. Specifically, a thin film of an inorganic material may be formed across the top face of the substrate 101, on which the components up to the upper electrode 107 have been formed, using a reactive sputtering method.

According to the method described above in sections a through j, the panel 10 may be manufactured to have the cross-sectional configuration illustrated in FIGS. 3A and 3B. However, the above-described method is merely an example. The formation method of each component may also employ other dry processes, patterning methods, wet processes, and so on, as appropriate.

(2) Convex Layer 103 Formation Method

Figure 9A:
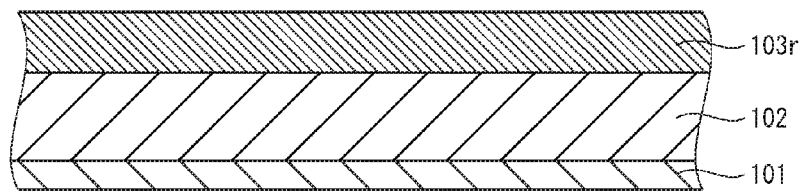
FIGS. 9A 9B, and 9C are schematic cross-sectional diagrams illustrating a formation process of the convex layer 103, where
Figure 9B:
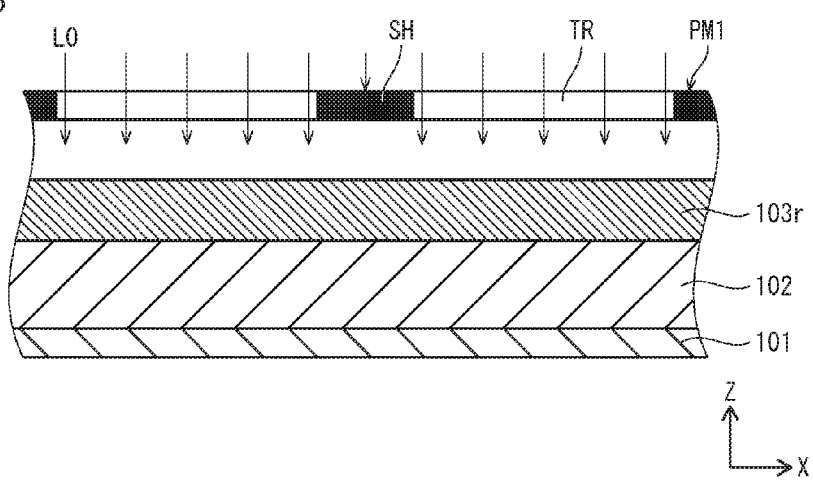
Figure 9C:
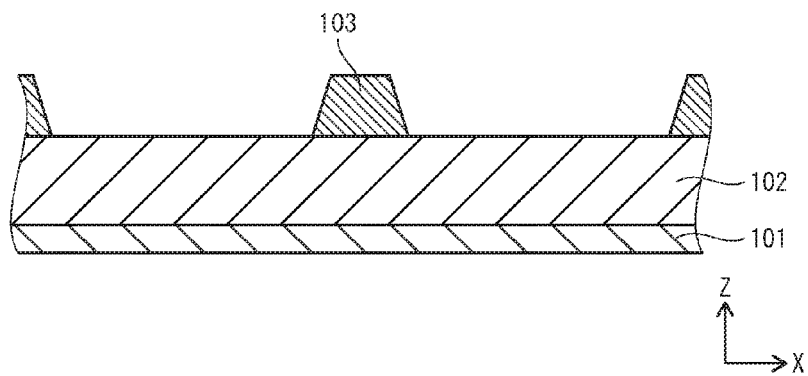

The formation method of the convex layer 103 is described in detail below. FIGS. 9A, 9B, and 9C are schematic cross-sectional diagrams illustrating the formation method of the convex layer of the panel 10.

a. Resin Material Application

First, as illustrated in FIG. 9A, a resin material 103$r$ is applied over the inter-layer insulation layer 102, prior to forming the lower electrodes 111, 121. The specific application method may be one of the wet processes listed above, such as a sputtering method, for example. Also, after application, low-temperature heat drying (i.e., pre-baking) or the like is performed, for example, by vacuum drying at a temperature of approximately 60° C. to 120° C. in order to remove unnecessary solvents. This beneficially fixes the resin material 103$r$ to the inter-layer insulation layer 102.

Here, the resin material 103$r$ is beneficially to the same as the resin material used for the inter-layer insulation layer 102. As a result, during the formation of the convex layer 103, the material, equipment, technology, and so on used for the inter-layer insulation layer 102 may be reused, which enables any decrease in manufacturing efficiency caused by the addition of the convex layer 103 to be constrained.

b. Exposure

Next, as illustrated in FIG. 9B, the resin material 103$r$ is exposed through a photomask PM1. Specifically, an exposure device or the like is used in which the photomask PM1 is arranged over the substrate 101 having the resin material 103$r$ applied thereto, and the resin material 103$r$ is irradiated with light L0 from above the photomask PM1.

The light L0 typically includes ghi compound rays (of 436 nm, 405 nm, and 365 nm). However, g rays (436 nm), h rays (405 nm), i rays (365 nm), an eximer laser, EUV, X rays, and the like may also be used, for example. The light L0 is set in accordance with the type of the resin material 103$r$ and a width of the convex layer 103. Also, the amount of the light L0 used for exposure may be set as appropriate to the type of the resin material 103$r$. For example, the exposure amount may be from 100 mJ/cm$^2$ to 500 mJ/cm$^2$.

The photomask PM1 includes an opaque portion SH that blocks the light L0 and transmissive portions TR that allow the light L0 to pass. As illustrated in FIG. 9B, when the resin material 103$r$ is, for instance, a positive photosensitive material, then the opaque portion SH is arranged over positions where the resin material 103$r$ is to remain and the transmissive portions TR are arranged over positions where the resin material 103$r$ is to be removed. Specifically, the photomask PM1 may have the opaque portion SH extending in the second direction Y and arranged in plurality with spacing along the first direction X, and the transmissive portions TR may be arranged between pieces of the opaque portion SH. Here, the regions under the transmissive portions TR correspond to where the lower electrodes 111, 121 are to be formed, and the region below the opaque portion SH corresponds to where the gap G is to be formed.

Exposure through the photomask PM1 causes the light L0 to pass only through the transmissive portions TR and reach the resin material 103$r$ below the transmissive portions TR. The solubility to developing fluid of the resin material 103$r$ that has been exposed to the light L0 is increased.

c. Developing

Next, as illustrated in FIG. 9C, developing is performed to form the convex layer 103 by removing photosensitive regions of the resin material 103$r$. The specific developing method may involve, for example, soaking the substrate 101, after exposure, in a developing fluid such as an organic solvent or alkaline solution that dissolves the resin material 103 that has been exposed. Afterward, the substrate 101 may be washed with a rinsing liquid such as pure water. As a result, the convex layer 103 is formed over the inter-layer insulation layer 102, and is shaped so as to extend in the second direction Y. The convex layer 103 may also be cured after developing, in order to improve the density of the convex layer 103, improve the adhesion with the inter-layer insulation layer 102, remove dross, and so on. Specifically, the convex layer 103 may be heated, after developing, on a hot plate, in a hot-air drying oven, under an infra-red lamp, or the like. The curing temperature and curing time may be set as appropriate in accordance with the resin material 103$r$, and may be, for example, from 150° C. to 250° C. and from 30 minutes to 120 minutes.

4. Remarks

In the panel 10, at least a part of the bottom face 105FB of the partition wall 105 is positioned higher than the bottom faces 105SB of the partition wall 105. As a result, sinking of the top face 105T is constrained at least at the part of the bottom face 105FP positioned higher than the bottom faces 105SB. Accordingly, irregularities in the top face 105T of the partition wall 105 are reduced. As such, this enables a reduction in the formation of cracks in upper layers such as the electron transport layer 106 and the upper electrode 107.

Also, in the panel 10, not only the organic light-emitting layers 113, 123 but also the hole transport layers 112, 122 are formed using a wet process. As such, constraining sinking of the top face 105T of the partition wall 105 makes ink less likely to run during formation of the hole transport layers 112, 122, improves formation precision for the hole transport layers 112, 122, and further stabilizes the quality of the panel 10.

In addition, in the panel 10, a central part of the bottom face 105FB in the first direction X is beneficially arranged at a higher position than the bottom faces 105SB. In a situation where the convex layer 103 is absent, sinking of the top face 105T of the partition wall 105 becomes greatest at the central part, which is in the midway between the lower electrodes 111, 121. As such, positioning the central portion of the bottom face 105FB in the first direction X, where the top face is most prone to sinking, higher than the bottom faces 105SB enables sinking of the top face 105T to be effectively constrained.

<Variations>

The panel 10 and the manufacturing method of the panel 10 have been described above as examples of implementation of the present disclosure. However, with the exception of components having essential characteristics, no limitation is intended to the above explanations. Variations are described below as other aspects of the disclosure. In the following, components identical to those described above use the same reference signs and explanations thereof are simplified or omitted.

(1) Inter-Layer Insulation Layer and Convex Layer Integration

Figure 10:
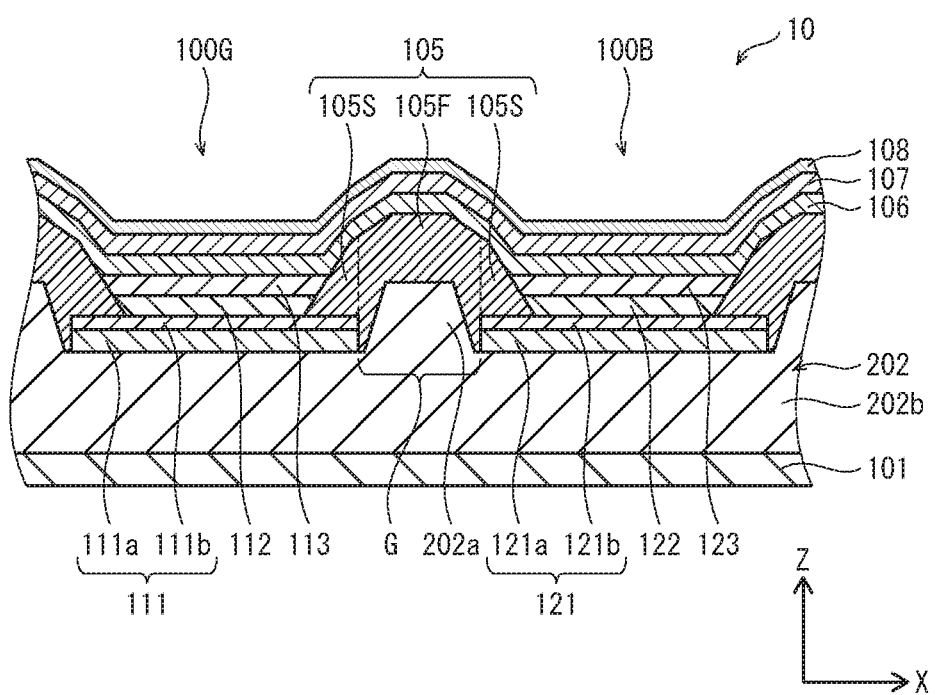
FIG. 10 is a schematic cross-sectional diagram illustrating an inter-layer insulation layer 202 pertaining to a variation.

In the embodiment, the inter-layer insulation layer 102 and the convex layer 103 are described as being distinct layers. However, the inter-layer insulation layer and the convex layer may also be a single layer. FIG. 10 is a schematic cross-sectional diagram illustrating an inter-layer insulation layer 202 pertaining to this variation. The inter-layer insulation layer 202 is formed from a resin material, and is disposed along the top face of the substrate 101. In addition, the inter-layer insulation layer 202 has a top face shaped in conformity with the top face of the substrate 101. The inter-layer insulation layer 202 includes a planar portion 202b on which the lower electrodes 111, 121 are disposed, and a convex portion 202a over the planar portion 202b corresponding to the gap G, and protruding upward, higher than top faces of the lower electrodes 111, 121.

Here, a part of the foundation of the partition wall 105, made up of the inter-layer insulation layer 202 having the convex portion 202a, below the first portion 105F protrudes upward higher than parts of the foundation below the second portions 105S. As a result, in the panel 10 equipped with the inter-layer insulation layer 202, at least part of the bottom face 105FB is raised above the bottom faces 105SB.

Figure 11A:
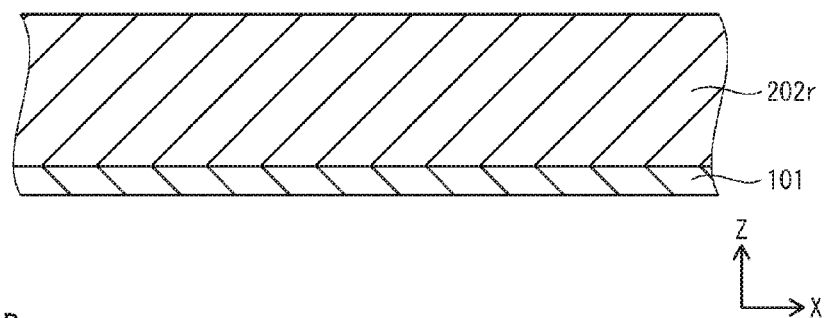
FIGS. 11A, 11B, and 11C are schematic cross-sectional diagrams illustrating a formation process of the inter-layer insulation layer 202, where
Figure 11B:
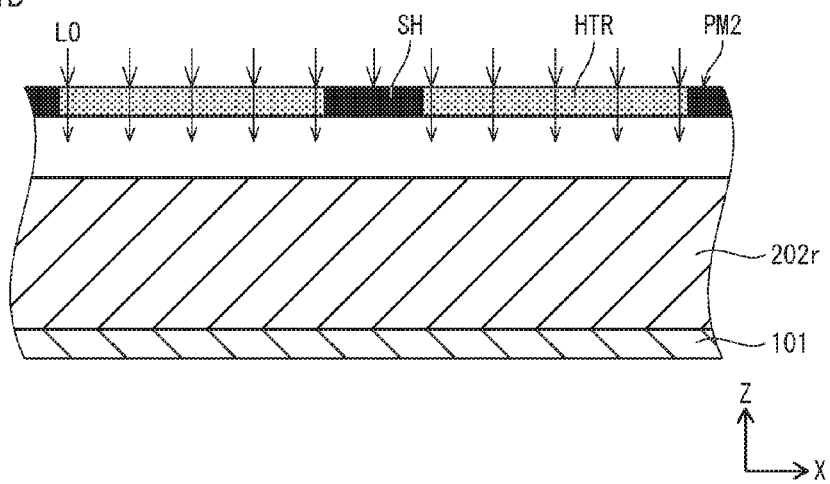
Figure 11C:
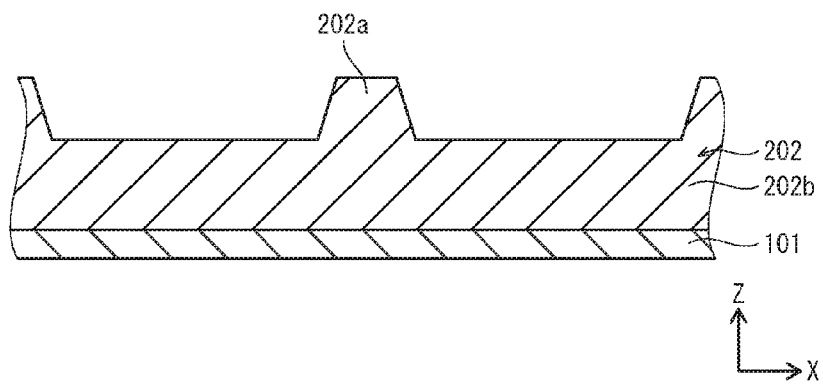

The following may be used as a formation method for the inter-layer insulation layer 202, for example. FIGS. 11A, 11B, and 11C are schematic cross-sectional diagrams illustrating the formation method for the inter-layer insulation layer 202. First, as illustrated in FIG. 11A, a resin material 202r is applied over the substrate 101 so as to have a top face shaped to conform to the top face of the substrate 101, prior to forming the lower electrodes 111, 121. For example, the resin material 202r may be applied with sufficient thickness to cover irregularities in the TFT layer. The resin material 202r is a positive photosensitive material, identical to resin material 103r.

Next, as illustrated in FIG. 11B, a portion of the resin material 202r is made semi-photosensitive through a photolithography method using a half-tone mask PM2. Specifically, for example, the resin material 202r may be exposed through the half-tone mask PM2, which has semi-transmissive portions HTR replacing the transmissive portions TR of the photomask PM1. Accordingly the light L0 is attenuated by the semi-transmissive portions HTR during exposure, enabling the resin material 202r under the semi-transmissive portions HTR to be made semi-photosensitive. Upper parts of the portions of the resin material 202r that have been made semi-photosensitive in the thickness direction (i.e., the Z direction in FIG. 11B) become photosensitive and more soluble in developing fluid. However, lower parts of the portions of the resin material 202r that have been made semi-photosensitive in the thickness direction remain not soluble in the developing fluid.

Subsequently, as illustrated in FIG. 11C, the resin material 202r, now semi-photosensitive, is developed. Thus, in the portions made semi-photosensitive, only the upper parts in the thickness direction are removed, thereby enabling a reduction in thickness. Accordingly, the inter-layer insulation layer 202 is formed to include the planar portion 202b having the top face shaped in conformity with the top face of the substrate 101, and the convex portion 202a protruding upward with respect to the planar portion 202b.

Figure 12A:
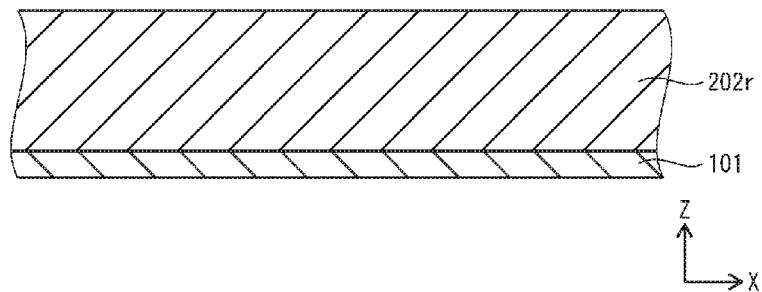
FIGS. 12A, 12B, and 12C are schematic cross-sectional diagrams illustrating a formation process of the inter-layer insulation layer 202, where
Figure 12B:
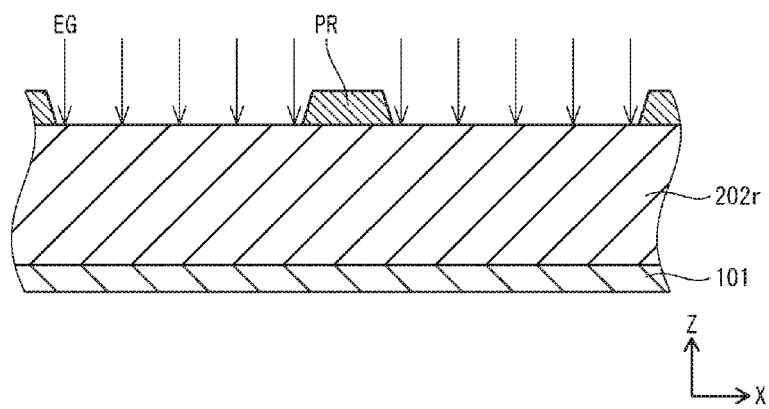
Figure 12C:
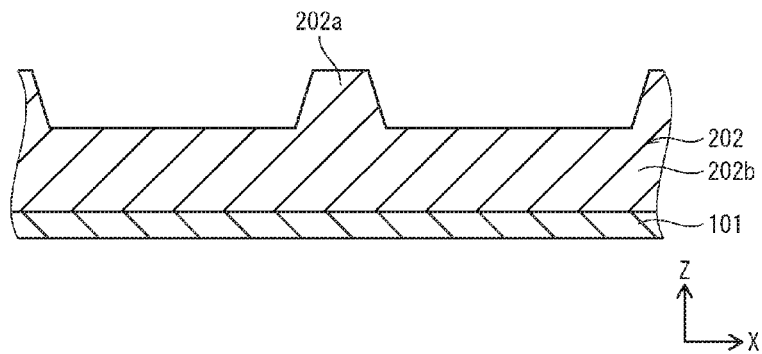

The following may also be used as a formation method for the inter-layer insulation layer 202, for example. FIGS. 12A, 12B, and 12C are schematic cross-sectional diagrams illustrating the formation method for the inter-layer insulation layer 202. First, as illustrated in FIG. 12A, the resin material 202r is applied over the substrate 101 so as to have a top face shaped to conform to the top face of the substrate 101, prior to forming the lower electrodes 111, 121.

Next, as illustrated in FIG. 12B, a photolithography method using dry etching is employed to reduce the thickness of a portion of the resin material. Specifically, the photolithography method is first used to apply a photoresist PR only to a portion where the convex portion 202a is to be formed. Here, the material of the photoresist PR is beneficially a positive photosensitive material, similarly to the resin material 202r. As a result, the possibility of a portion forming the convex portion 202a becoming photosensitive is decreased. Then, a compound gas of oxygen and plasma-fied tetrafluoromethane ($CF_4$) may be used to remove the upper part of the resin material 202r where the photoresist PR is not disposed.

Subsequently, as illustrated in FIG. 11C, peeling the photoresist PR from the substrate 101 using a peeling solution or the like enables the inter-layer insulation layer 202 to be formed with the planar portion 202b and the convex portion 202a as described above.

In addition, the remainder of the manufacturing method of the panel 10 may involve forming the lower electrodes 111, 121 such that the first lower electrode 111 and the second lower electrode 121 are respectively formed with thickness that is less than a difference in thickness between the convex portion 202a and the planar portion 202b, over parts of the planar portion 202b each at a difference side of the convex portion 202a in the first direction X. The rest proceeds as described in the embodiment.

Figure 13:
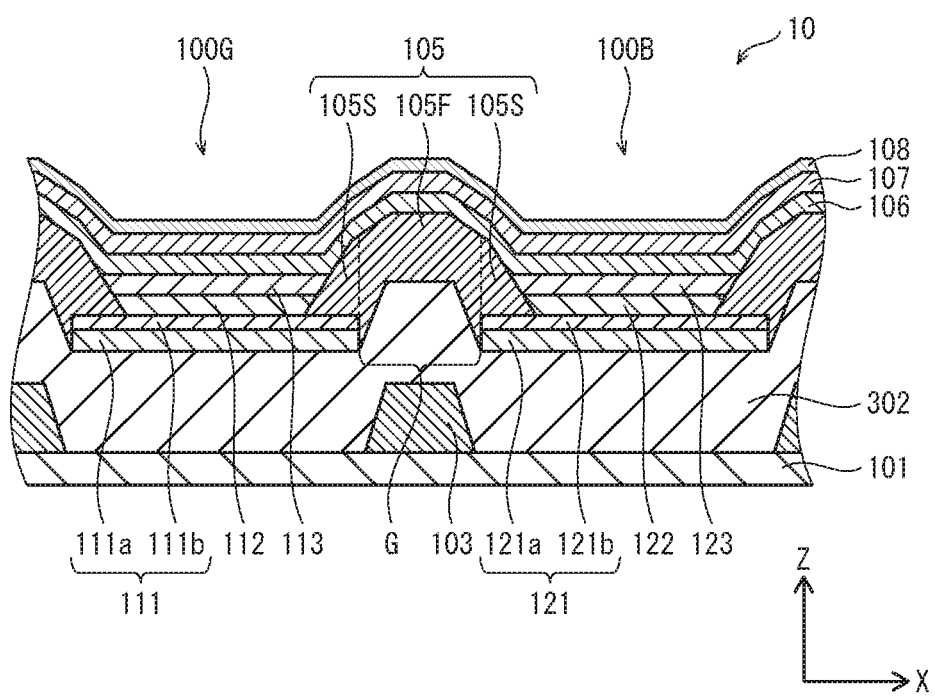
FIG. 13 is a schematic cross-sectional diagram illustrating an inter-layer insulation layer 302 pertaining to a variation.

(2) Lamination and Formation Order of Inter-Layer Insulation Layer and Convex Layer In the embodiment, the inter-layer insulation layer 102 and the convex layer 103 are formed in the stated order and are therefore laminated in the stated order. However, the lamination and formation order may be reversed. FIG. 13 is a schematic cross-sectional diagram illustrating an inter-layer insulation layer 302 pertaining to this variation. In the present variation, the convex layer 103 is disposed directly over the substrate 101, between the substrate 101 and the first portion 105F.

The inter-layer insulation layer 302 is formed from a resin material, is arranged over the substrate 101 and the convex layer 103, and is shaped to have a top face that conforms to the top face of the substrate 101 and the top face of the convex layer 103. Also, the lower electrodes 111, 121 are arranged over the inter-layer insulation layer 302.

The thickness of the convex layer 103 is greater than the thickness of the lower electrodes 111, 121. The inter-layer insulation layer 302 has a top face shaped in conformity with the top face of the substrate 101 and the top face of the convex layer 103. As such, a part of the inter-layer insulation layer 302, which is the foundation of the partition wall 105, below the first portion 105F protrudes upward higher than parts of the inter-layer insulation layer 302 below the second portions 105S. As a result, in the panel 10 equipped with the inter-layer insulation layer 302, at least part of the bottom face 105FB is raised above the bottom faces 105SB.

The formation method for the inter-layer insulation layer 302 may, for example, involve using a resin material to form the convex layer 103 with a shape extending in the second direction Y over the substrate 101 prior to forming the lower electrodes 111, 121, and using the same resin material as the convex layer 103 to form the inter-layer insulation layer 302 over the substrate 101 and the convex layer 103 with a top face shaped in conformity with the top face of the substrate 101 and the top face of the convex layer 103. Here, for example, the inter-layer insulation layer 302 may be formed with a thickness on the same order as the thickness of the convex layer 103. The thickness of the convex layer 103 and the thickness of the inter-layer insulation layer 302 may be determined as appropriate for the shape and specifications of the panel 10. However, when the thickness of the convex layer 103 is, for example, from 0.5 µm to 1 µm, the thickness of the inter-layer insulation layer 302 is from 3 µm to 5 µm. Specifically, the formation method for the convex layer 103 and the inter-layer insulation layer 302 may be identical to the previously-described formation method for the inter-layer insulation layer 102 and the convex layer 103.

In addition, the ensuing manufacturing method of the panel 10 may involve forming the lower electrodes 111, 121 such that the first lower electrode 111 and the second lower electrode 121 are respectively formed with thickness that is less than the thickness of the convex layer 103, over parts of the inter-layer insulation layer 302 each at a different side of the convex portion 103 in the first direction X. The rest proceeds as described in the embodiment.

(3) Lamination and Formation Order of Convex Layer and Lower Electrode

Figure 14:
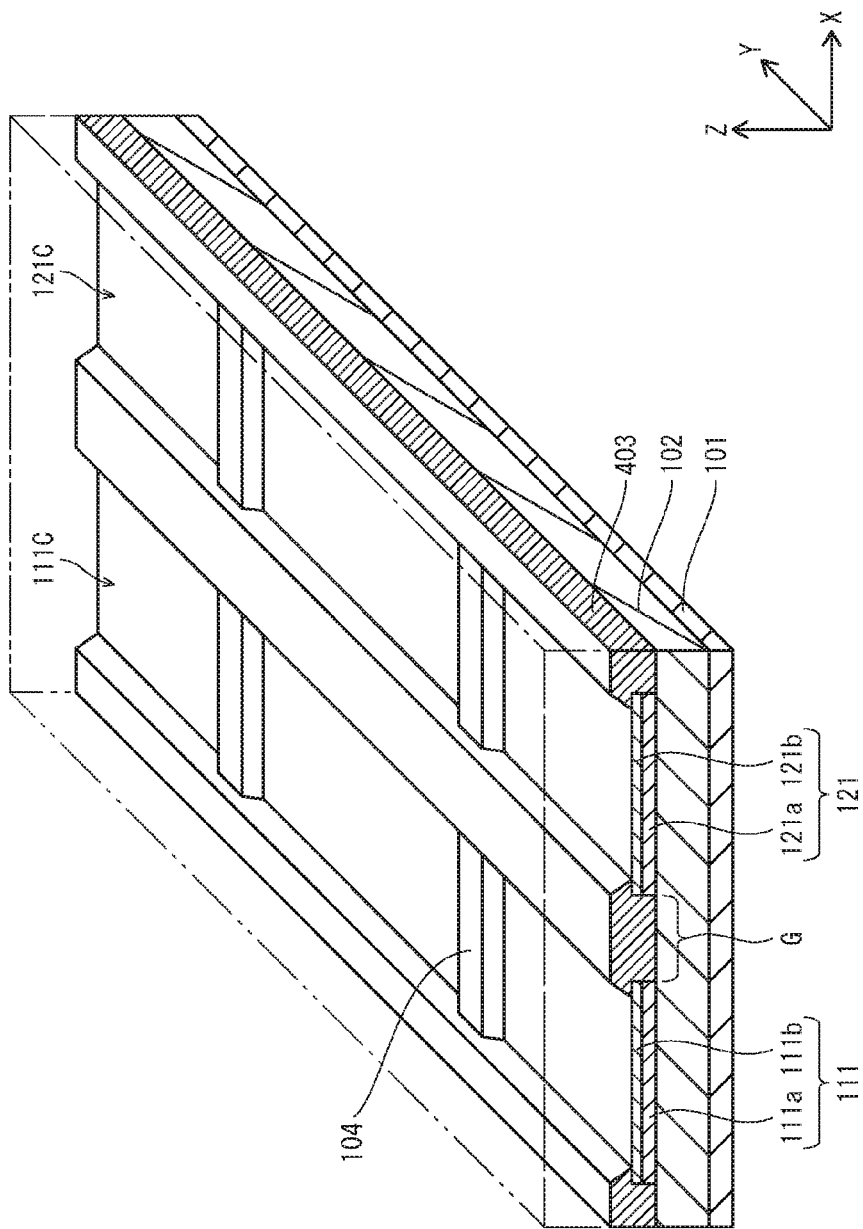
FIG. 14 is a schematic perspective view diagram illustrating a convex layer 403 pertaining to a variation.

In the embodiment, the convex layer 103 and the lower electrodes 111, 121 are formed in the stated order and are therefore laminated in the stated order. However, the lamination and formation order may be reversed. FIG. 14 is a schematic perspective view illustrating a convex layer 403 pertaining to this variation. FIG. 14, like FIG. 5, illustrates a state before forming the partition wall 105. In the present variation, the partition wall 105 and the respective layers formed after the partition wall 105 are identical to the embodiment.

Similarly to convex layer 103, convex layer 403 is formed from an electrically resistant material, is disposed between the substrate 101 and the first portion 105F, and is shaped to extend along the second direction Y. The thickness of the convex layer 403 is greater than the thickness of the lower electrodes 111, 121 and the thickness of the pixel insulation layer 104. In addition, the convex layer 403 and the pixel insulation layer 104 are formed integrally as a single layer, and thus, the convex layer 403 is formed after the lower electrodes 111, 121. Further, the convex layer 403 is disposed so as to cover neighboring ends of the first lower electrode 111 and the second lower electrode 121.

The thickness of the convex layer 403 is greater than the thickness of the lower electrodes 111, 121. As such, a part of the foundation of the partition wall 105, made up of the lower electrodes 111, 121 and the convex layer 403, below the first portion 105F protrudes higher than parts of the foundation below the second portions 105S (above the lower electrodes 111, 121). As a result, in the panel 10 equipped with the convex layer 403, at least part of the bottom face 105FB is raised above the bottom faces 105SB.

The formation method for the convex layer 403 may involve, for example first using an electrically insulating material to form an insulating layer on the top face of the substrate 101 having the lower electrode columns 111C, 121C formed thereon, prior to forming the partition wall 105, so that the insulating layer has greater thickness than the lower electrodes 111, 121. Next, a photolithography method is used to remove parts of the insulating layer over the lower electrodes 111, 121, and to form the convex layer 403 extending in the second direction Y between the first lower electrode column 111C and the second lower electrode column 121C and the pixel insulation layer 104 extending in the first direction X and having less thickness than the convex layer 403 between pairs of the first lower electrodes 111 and pairs of the second lower electrodes 121. Here, a half-tone mask may be used in the photolithography method to form the pixel insulation layer 104 with less thickness than the convex layer 403. The specific method may be identical to the formation method of the inter-layer insulation layer 202 illustrated in FIG. 11.

As described above, forming the convex layer 403 and the pixel insulation layer 104 as a single layer enables the convex layer 403 to be formed at the same time as the pixel insulation layer 104 and enables any decrease in manufacturing efficiency caused by the addition of the convex layer 403 to be constrained.

(4) Partition Wall Foundation Layers

Figure 15:
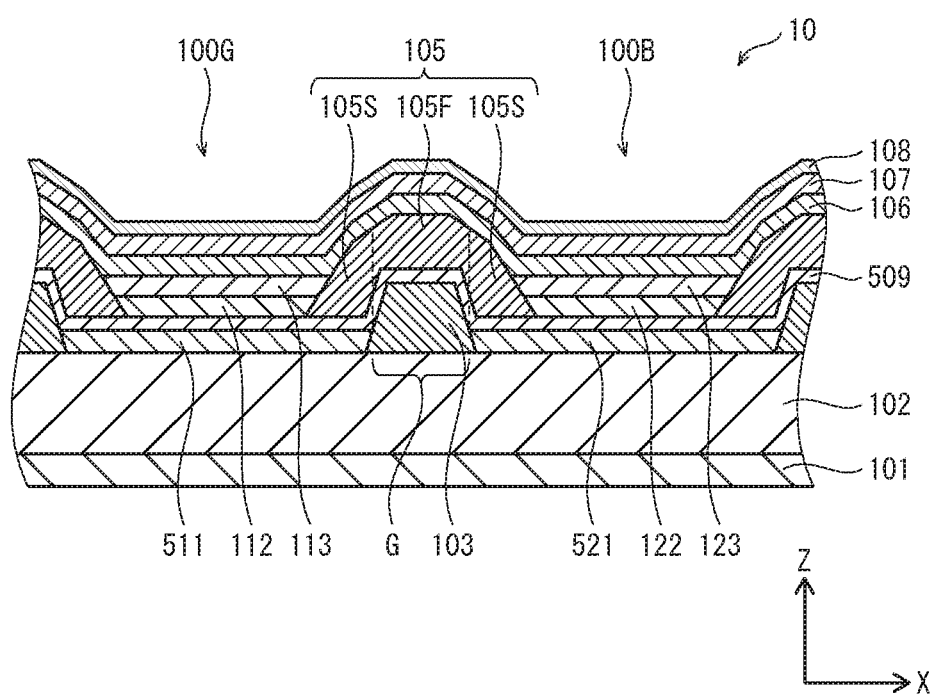
FIG. 15 is a schematic cross-sectional diagram illustrating a hole injection layer 509 pertaining to a variation.

In the embodiment, the convex layer 103, the pixel insulation layer 104, and the lower electrodes 111, 121 form a foundation of the partition wall 105. However, no such limitation is intended. FIG. 15 is a schematic cross-sectional diagram illustrating a hole injection layer 509 pertaining to this variation. In the present variation, a first lower electrode 511 and a second lower electrode 511, respectively corresponding to the first metal layer 111a and the second metal layer 121a of the embodiment, and a hole injection layer 509 serving as a replacement member for the first oxide layer 111b and the second oxide layer 121b of the embodiment, are provided. As such, in this variation, the hole injection layer 509 is the foundation for the partition wall 105.

The hole injection layer 509 uses the same material and has the same function as the first oxide layer 111b and the second oxide layer 121b, and may be termed a cover layer disposed across the entirety of the convex layer 103, the first lower electrode 511, and the second lower electrode 521.

In addition, the hole injection layer 509 is sufficiently thin (e.g., the thickness of the hole injection layer 509 is on the order of a few tens of nm when the thicknesses of the first lower electrode 511, the second lower electrode 521, and the convex layer are from a few hundred nm to a few µm) to cover irregularities on the top face of the convex layer 103 and on the top faces of the first lower electrode 511 and the second lower electrode 521. That is, a part of the foundation of the partition wall 105 below the first portion 105F protrudes upward higher than parts of the foundation below the second portions 105S. As a result, the panel 10 equipped with the hole injection layer 509 also has at least part of the bottom face 105FB raised above the bottom faces 105SB.

In addition, the formation method for the hole injection layer 509 may, for example, involve first forming only a metal film as formed in the formation method of the lower electrodes 111, 121 of the embodiment, and then using patterning to form the first lower electrode 511 and the second lower electrode 521. Next, the hole injection layer 509 is yielded by forming a thin film of metal oxide according to the method of the embodiment.

Also, as illustrated in FIG. 15, the first lower electrode 511 and the second lower electrode 521 may be formed to be in contact with inclined surfaces of the convex layer 103. In such a situation, electrical insulation is also secured between the first lower electrode 511 and the second lower electrode 521 by the convex layer 103. Further, having this shape tolerance widens the range of tolerable error in the patterning area of the first lower electrode 511 and the second lower electrode 521, and imparts some slack in alignment precision.

(5) Other

In the panel 10, the color of emitted light of the first organic light-emitting layer 113 and the color of emitted light of the second organic light-emitting layer 123 differ. However, no such limitation is intended. The color of emitted light of the first organic light-emitting layer 113 and the color of emitted light of the second organic light-emitting layer 123 may also be identical. Specifically, for example, the color of emitted light of all organic light-emitting layers including the first organic light-emitting layer and the second organic light-emitting layer may be white such as in an organic electroluminescence display panel using a color modulation scheme or a color filter scheme. In addition, for example, the partition wall may be shaped as a lattice (i.e., a pixel bank) individually partitioning each lower electrode, and members corresponding to the convex layer 103 may be disposed in gaps (i.e., gaps between lower electrodes aligned in the Y direction of the panel 10) between sub-pixels emitting light of the same color. That is, in the panel 10, a cross-section along each sub-pixel column, which is a line of sub-pixels emitting the same color, may also have the configuration illustrated in FIG. 3A instead of the configuration illustrated in FIG. 3B. As described above, even if the color of emitted light of the first organic light-emitting layer and the color of emitted light of the second organic light-emitting layer are identical, constraining sinking of the top surface of the partition wall therebetween prevents ink from running across the partition wall, enabling improvements to the formation precision in terms of organic light-emitting layer thickness.

Here, configuring the partition wall as described above, in a situation as in the panel 10 where the color of emitted light of the first organic light-emitting layer 113 and the color of emitted light of the second organic light-emitting layer 123 are different, constrains the occurrence of not only formation degradation in terms of film formation thickness but also of mixing (color combination) of ink including different organic light-emitting materials. That is, quality degradation of the panel 10 may be suppressed by preventing faulty pixels P and the like.

Also, in FIG. 5, the pixel insulation layer 104 is arranged over the convex layer 103. However, no such limitation is intended. The pixel insulation layer 104 may be provided only between pairs of the convex layer 103.

In addition, in the panel 10, as illustrated in FIG. 2, the direction of extension of the pixel insulation layer 104 is a major axis (X) direction of the panel 10 and the direction of extension of the partition wall 105 is a minor axis (Y) direction of the panel 10. However, the respective directions of extension of the pixel insulation layer and the partition wall may be reversed. Also, the direction of extension of the pixel insulation layer and of the partition wall may be a direction unrelated to the shape of the panel 10. Furthermore, the pixel insulation layer and the partition wall may intersect at an angle other than 90°, provided that intersection occurs. Also, in such a situation, the direction of arrangement of the sub-pixel columns CR, CG, and CB may be parallel to the direction of extension of the partition wall.

In addition, in the panel 10, the material of the first oxide layer 111b, the second oxide layer 121b, and the hole injection layer 509 having the capacity to inject holes is a metal oxide material. However, no such limitation is intended. An organic material such as PEDOT (a compound of polythiophene and polystyrene acid) may also be used. In such a situation, the hole injection layer may be formed using a wet process.

Also, in the panel 10, the hole transport layers 112, 122 are formed using a wet process. However, no such limitation is intended. A dry process may also be used. In addition, when a dry process is used, the hole transport layers 112, 122 may be continuous with one another crossing the partition wall 105, similarly to the hole injection layer 509.

Further, in the panel 10, each of the electron transport layer 106 and the upper electrode 107 is a continuous layer crossing the partition wall 105. However, for example, a wet process may be used to arrange the electron transport layer 106 and the upper electrode 107 independently on each sub-pixel column CR, CG, and CB. In addition, for example, the electrodes and functional layers making up the organic electroluminescence elements may be independently arranged in each of the sub-pixels 100R, 100G, and 100B.

Also, in the panel 10, the image display face is described as rectangular. However, no such limitation is intended to the shape of the image display face. For instance, the image display face may be triangular, square, pentagonal or otherwise polygonal, round, elliptical, or a combination of these shapes. Here, an image display region (i.e., arrangement range of the sub-pixels 100R, 100G, and 100B) of the image display face may be shaped to suit the image display face, or may have a different shape. For example, the image display region may be elliptical or similar while the image display face is rectangular. Furthermore, the shape of the substrate may correspond to the shape of the image display face, and the shape of a face other than the image display face may be different than the image display face.

Also, in the panel 10, the lower electrodes 111, 121 are rectangular plate-shaped members. However, no such limitation is intended. The lower electrodes 111, 121 may also have a polygonal plate shape, an elliptical plate shape, or a combination thereof. In addition, the lower electrodes 111, 121 may have concavities in conformity with the shape of contact holes in the inter-layer insulation layer 102.

Also, in the panel 10, the sub-pixels 100R, 100G, and 100B are aligned according to the respective red, green, and blue emitted light. However, no such limitation is intended to the color of light emitted by the sub-pixels. For example, all light may be uniformly red, or a combination of four colors such as red, green, blue, and yellow may be used. In addition, the sub-pixels are not limited to being provided as one per color in each pixel P, and may also be provided in plurality. Also, the arrangement of the sub-pixels in the pixels P is not limited to red, green, and blue in order as illustrated in FIG. 2. A permutation thereof may also be used.

Also, in the panel 10, the lower electrodes 111, 121 serve as anodes and the upper electrode 107 serves as a cathode. However, no such limitation is intended. An opposite configuration, in which the lower electrodes serve as cathodes and the upper electrode serves as an anode, may also apply. In such a situation, the lamination order of the hole injection layer, the hole transport layer, and the electron transport layer may be adjusted as appropriate.

Also, in FIG. 2, only the sub-pixels 100R, 100G, and 100B are arranged between pairs of the partition wall 105. However, a bus bar (i.e., an auxiliary electrode) may also be arranged there in order to reduce the influence of voltage drops caused by resistive components of the upper electrode 107.

Also, the panel 10 is equipped with a laminated structure in which, for example, an electron injection layer, an inhibition layer, a buffer layer, and so on may also be provided. In addition, a subset of the above-described components may also be omitted. Further, an electron injection and transport layer, for instance, may physically be a single layer having a plurality of functions. Also, a sealing plate made of a glass material or the like may be disposed over the thin film sealing layer 108 as a protective member for the other components. Here, a space between the thin film sealing layer 108 and this sealing plate may, for example, be filled with a curable resin material, thus improving adhesion between the thin film sealing layer 108 and the sealing plate. Also, color filters may be arranged at positions of the sealing plate corresponding to the sub-pixels 100R, 100G, and 100B to correct the color of emitted light. In addition, a black matrix may be arranged at positions corresponding to positions between the sub-pixels 100R, 100G, and 100B on the sealing plate and at a peripheral region of the sealing plate in order to constrain reflection of outside light and to improve contrast.

Also, the panel 10 is described as employing top emission and an active matrix scheme. However, no such limitation is intended. For instance, bottom emission and a passive matrix scheme may also be employed.

An organic electroluminescence display panel and organic electroluminescence display panel manufacturing method pertaining to the present disclosure are widely applicable to manufacturing display panels for use in electronic devices such as televisions, personal computers, mobile terminals, commercial displays, and so on.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic electroluminescence display panel, comprising:
   a substrate;
   a first lower electrode and a second lower electrode disposed over the substrate and spaced away from one another in a first direction along a top face of the substrate by a gap;
   a partition wall comprising an electrically insulating material and separating a space above the first lower electrode and a space above the second lower electrode from one another, the partition wall including a first portion disposed over the gap and two second portions each of which is disposed over a different one of the first lower electrode and the second lower electrode, the first portion disposed between the two second portions in the first direction;
   a convex layer made of an electrically insulating material between the substrate and the first portion, the convex layer having greater thickness than the first lower electrode and the second lower electrode;
   a first organic light-emitting layer and a second organic light-emitting layer respectively disposed in the space above the first lower electrode and the space above the second lower electrode; and
   an upper electrode extending over the first organic light-emitting layer and the second organic light-emitting layer, wherein
   at least a part of a bottom face of the first portion is positioned higher than a bottom face of at least one of the two second portions,
   the convex layer comprises cured resin,
   the partition wall comprises cured resin, and
   the part of the bottom face of the first portion is directly on a top surface of the convex layer.

2. The organic electroluminescence display panel according to claim 1, wherein
   in the first direction, a central part of the bottom face of the first portion is positioned higher than the bottom face of the at least one of the two second portions.

3. The organic electroluminescence display panel according to claim 1, further comprising:
   an inter-layer insulating layer comprising a resin material and disposed over the substrate, a shape of a top face of the inter-layer insulating layer in conformity with a shape of the top face of the substrate, wherein
   the first lower electrode, the second lower electrode, and the convex layer are disposed over the inter-layer insulating layer.

4. The organic electroluminescence display panel according to claim 1, further comprising:
   an inter-layer insulating layer comprising a resin material and disposed over the substrate, a shape of a top face of the inter-layer insulating layer in conformity with a shape of the top face of the substrate, wherein
   the inter-layer insulating layer includes a planar portion on which the first lower electrode and the second lower electrode are disposed and the convex layer.

5. The organic electroluminescence display panel according to claim 1, wherein
   in a second direction that is along the top face of the substrate and that is perpendicular to the first direction, the first lower electrode is provided in plurality to form a line of first lower electrodes, and the second lower electrode is provided in plurality of form a line of second lower electrodes,
   the first organic light-emitting layer extends in the second direction over the line of first lower electrodes, and the second organic light-emitting layer extends in the second direction over the line of second lower electrodes, and
   the partition wall extends in the second direction between the first organic light-emitting layer and the second organic light-emitting layer, and in any cross-section taken along the second direction, the part of the bottom face of the first portion is positioned higher than the bottom face of the at least one of the two second portions.

6. The organic electroluminescence display panel according to claim 5, wherein
the convex layer extends in the second direction, and
the convex layer has greater thickness than the first lower electrodes and the second lower electrodes.

7. The organic electroluminescence display panel according to claim 6, further comprising:
a pixel insulation layer comprising an electrically insulating material, extending in the first direction, and disposed between electrodes adjacent in the second direction, the electrodes adjacent in the second direction comprising a combination of two first lower electrodes and a combination of two second lower electrodes, wherein
the pixel insulation layer has greater thickness than the first lower electrodes and the second lower electrodes, and has smaller thickness than the convex layer.

8. The organic electroluminescence display panel according to claim 7, wherein
the convex layer and the pixel insulation layer form a single layer.

9. The organic electroluminescence display panel according to claim 1, wherein
a color of light emitted by the first organic light-emitting layer differs from a color of light emitted by the second organic light-emitting layer.

\* \* \* \* \*